(12) United States Patent
Park et al.

(10) Patent No.: US 12,016,130 B2
(45) Date of Patent: Jun. 18, 2024

(54) METHOD OF MANUFACTURING PRINTED CIRCUIT BOARD

(71) Applicant: SAMSUNG ELECTRO-MECHANICS CO., LTD., Suwon-si (KR)

(72) Inventors: Chan Jin Park, Suwon-si (KR); Jong Eun Park, Suwon-si (KR); Hyun Seok Yang, Suwon-si (KR); Sangik Cho, Suwon-si (KR); Hiroki Okada, Suwon-si (KR); Young Ook Cho, Suwon-si (KR); Mi Jeong Jeon, Suwon-si (KR); In Jae Chung, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 29 days.

(21) Appl. No.: 17/683,604

(22) Filed: Mar. 1, 2022

(65) Prior Publication Data

US 2022/0386473 A1    Dec. 1, 2022

(30) Foreign Application Priority Data

May 26, 2021 (KR) .......................... 10-2021-0067681
Oct. 1, 2021 (KR) .......................... 10-2021-0131108

(51) Int. Cl.
| | |
|---|---|
| *H05K 3/18* | (2006.01) |
| *C25D 5/02* | (2006.01) |
| *C25D 7/00* | (2006.01) |
| *G03F 7/20* | (2006.01) |

(52) U.S. Cl.
CPC ............. *H05K 3/188* (2013.01); *C25D 5/022* (2013.01); *C25D 7/00* (2013.01); *G03F 7/20* (2013.01); *H05K 2203/025* (2013.01)

(58) Field of Classification Search
None
See application file for complete search history.

(56) References Cited

U.S. PATENT DOCUMENTS

| | | | |
|---|---|---|---|
| 2005/0023145 A1* | 2/2005 | Cohen ..................... | C25D 5/022 205/135 |
| 2009/0294979 A1* | 12/2009 | Ito .......................... | H05K 3/465 257/E21.585 |
| 2019/0019616 A1* | 1/2019 | Cha ........................ | H01F 17/04 |
| 2022/0232699 A1* | 7/2022 | Ikebe ..................... | H05K 3/181 |
| 2023/0050814 A1* | 2/2023 | Ikebe ...................... | C25D 5/10 |

FOREIGN PATENT DOCUMENTS

| | | | |
|---|---|---|---|
| JP | H10-173315 A | | 6/1998 |
| KR | 20040072284 A | * | 8/2004 |

* cited by examiner

*Primary Examiner* — Louis J Rufo
(74) *Attorney, Agent, or Firm* — Morgan, Lewis & Bockius LLP

(57) ABSTRACT

A method of manufacturing a printed circuit board includes: forming a resist layer; exposing first areas of the resist layer spaced apart from each other; after exposing the first areas, exposing second areas of the resist layer, the second areas being spaces between the first areas; forming first and second openings spaced apart from each other in the first and second areas by developing the resist layer; and forming a plurality of conductor patterns by filling the first and second openings with conductors.

13 Claims, 28 Drawing Sheets

METHOD OF MANUFACTURING PRINTED CIRCUIT BOARD

CROSS-REFERENCE TO RELATED APPLICATION(S)

This application claims benefit of priority to Korean Patent Application Nos. 10-2021-0067681 filed on May 26, 2021 and 10-2021-0131108 filed on Oct. 1, 2021 in the Korean Intellectual Property Office, the entire disclosures of which are incorporated herein by reference for all purposes.

TECHNICAL FIELD

The present disclosure relates to a method of manufacturing a printed circuit board.

BACKGROUND

Electronic devices in the information technology (IT) field, including mobile phones, have become lighter, thinner, shorter and smaller while being more advanced in performance. To meet such technical demands, printed circuit boards, on which electronic components such as integrated circuits (ICs) are mounted, are also required to be lighter, thinner, shorter, and smaller, and conductor patterns formed in the printed circuit boards are also required to be highly dense.

In order to make the printed circuit board lighter, thinner, shorter and smaller and make the conductor patterns formed in the printed circuit board highly dense, it may be considered, with respect to any one conductor pattern layer of the printed circuit board, to reduce a line width of each conductor pattern and a space between adjacent conductor patterns, and to improve an aspect ratio (A/R) of each conductor pattern.

Meanwhile, the price of exposure equipment used for patterning a conductor pattern layer exponentially increases based on performance thereof, such as resolution, which is a major factor in determining line width of each conductor pattern of the conductor pattern layer and a space between adjacent conductor patterns. When high-performance exposure equipment is used, the manufacturing cost of the printed circuit board increases.

SUMMARY

An aspect of the present disclosure may provide a method of manufacturing a printed circuit board for forming conductor patterns having a relatively high aspect ratio (AR) in a narrow space while using conventional exposure equipment.

According to an aspect of the present disclosure, a method of manufacturing a printed circuit board may include: forming a resist layer; exposing first areas of the resist layer spaced apart from each other; after exposing the first areas, exposing second areas of the resist layer, the second areas being spaces between the first areas; forming first and second openings spaced apart from each other in the first and second areas by developing the resist layer; and forming a plurality of conductor patterns by filling the first and second openings with conductors.

According to another aspect of the present disclosure, a method of manufacturing a printed circuit board may include: forming a first resist layer; forming first openings spaced apart from each other in the first resist layer; forming first plating patterns spaced apart from each other by at least partially filling the first openings; removing the first resist layer; forming a second resist layer covering the first plating patterns; forming second openings spaced apart from each other in the second resist layer; and forming second plating patterns by at least partially filling the second openings. At least one of the second openings may be formed in a space between adjacent ones of the first plating patterns, and at least another one of the second openings may expose at least one of the first plating patterns.

According to another aspect of the present disclosure, a method of manufacturing a printed circuit board may include: forming a first resist layer; forming first openings spaced apart from each other in the first resist layer; forming first plating patterns spaced apart from each other by at least partially filling the first openings; removing the first resist layer; forming a second resist layer covering the first plating patterns; forming second openings spaced apart from each other in the second resist layer; and forming second plating patterns by at least partially filling the second openings. The first plating patterns and/or the second plating patterns are formed by performing plating to be thicker than the first resist layer and/or the second resist layer, and then removing partial portions thereof protruding beyond the first resist layer and/or the second resist layer.

According to another aspect of the present disclosure, a method of manufacturing a printed circuit board may include: forming a first resist layer; forming first plating patterns spaced apart from each other in the first resist layer; removing the first resist layer; forming a second resist layer covering the first plating patterns; forming second plating patterns spaced apart from each of the first plating patterns in the second resist layer; removing the second resist layer; forming a third resist layer covering the first and second plating patterns; and forming a third plating pattern spaced apart from each of the first and second plating patterns in the third resist layer. The third plating pattern is higher than each of the first and second plating patterns.

According to another aspect of the present disclosure, a method of manufacturing a printed circuit board may include: forming first plating patterns spaced apart from each other on a base; after forming the first plating patterns, forming second plating patterns spaced apart from each other on the base, wherein the first plating patterns and the second plating patterns are alternately disposed on the base; forming a resist layer on the base to cover the first and second plating patterns; and forming a third plating pattern in the resist layer. The third plating pattern on the base may be higher than each of the first and second plating patterns.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
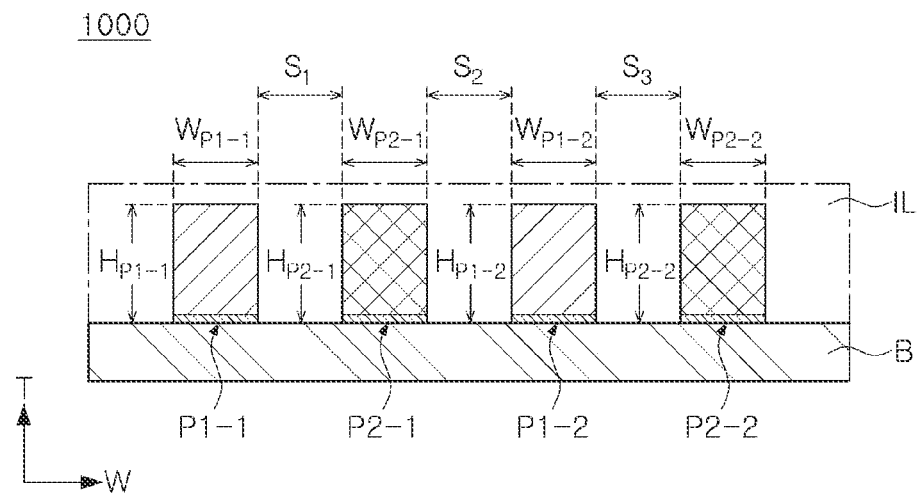
FIG. 1 is a view schematically illustrating a portion of a printed circuit board according to an exemplary embodiment of the present disclosure.

Hereinafter, exemplary embodiments of the present disclosure will now be described in detail with reference to the accompanying drawings.

In the drawings, a first direction may be defined as a T direction or a thickness direction, a second direction may be defined as a L direction or a length direction, and a third direction may be defined as a W direction or a width direction.

FIG. 1 is a view schematically illustrating a portion of a printed circuit board according to an exemplary embodiment of the present disclosure.

Referring to FIG. 1, a printed circuit board 1000 according to an exemplary embodiment of the present disclosure may include a base B, a conductor pattern layer disposed on the base B, and an insulating layer IL disposed on one surface of the base B to cover the conductor pattern layer.

The base B may include at least one of conductor pattern layers, interlayer insulating layers each disposed between adjacent ones of the conductor pattern layers, and a via penetrating through at least one of the interlayer insulating layers to connect the adjacent conductor pattern layers to each other. When it is assumed as an example that the printed circuit board 1000 according to the present exemplary embodiment includes a total of four conductor pattern layers, a total of three insulating layers each disposed between adjacent ones of the conductor pattern layers, two solder resist layers formed on outermost ones of the insulating layers, respectively, and a via penetrating through at least one of the insulating layers, a conductor pattern layer to be described later may be, for example, an uppermost conductor pattern layer, and the base B may include a total of three conductor pattern layers, a total of three insulating layers, a lowermost solder resist layer, and a via, all of which are disposed below the uppermost conductor pattern layer.

The conductor pattern layer P1-1, P2-1, P1-2, and P2-2 may be disposed on one surface of the base B. The conductor pattern layer P1-1, P2-1, P1-2, and P2-2 may be used as at least one of a ground layer, a signal layer, and a power layer in the multilayer board, but is not limited thereto.

The conductor pattern layer P1-1, P2-1, P1-2, and P2-2 may be disposed to protrude from one surface of the base B. For example, by forming the conductor pattern layer P1-1, P2-1, P1-2, and P2-2 after forming the base B, the conductor pattern layer P1-1, P2-1, P1-2, and P2-2 may be disposed to protrude from one surface of the base B.

The conductor pattern layer P1-1, P2-1, P1-2, and P2-2 may include a plurality of conductor patterns P1-1, P2-1, P1-2, and P2-2 disposed to be spaced apart from each other on one surface of the base B. The plurality of conductor patterns P1-1, P2-1, P1-2, and P2-2 may include first-group conductor patterns P1-1 and P1-2 including a 1-1st conductor pattern P1-1 and a 1-2nd conductor pattern P1-2 spaced apart from each other, and second-group conductor patterns P2-1 and P2-2 including a 2-1st conductor pattern P2-1 and a 2-2nd conductor pattern P2-2 spaced apart from each other. At least one of the second-group conductor patterns P2-1 and P2-2 (e.g., the 2-1st conductor pattern P2-1) may be disposed in a space between the first-group conductor patterns P1-1 and P2-1. The first-group conductor patterns P1-1 and P1-2 and the second-group conductor patterns P2-1 and P2-2 may be formed through the same plating method. Meanwhile, the conductor pattern layer P1-1, P2-1, P1-2, and P2-2 may further include at least one of a signal pattern, a ground pattern, and a power pattern formed at a position spaced apart from the plurality of conductor patterns P1-1, P2-1, P1-2, and P2-2.

Figure 6:
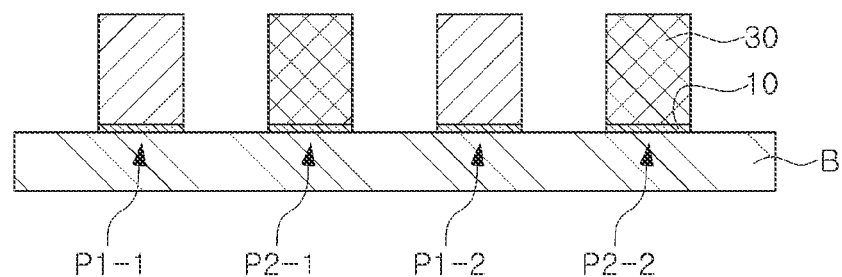

Each of the conductor patterns P1-1, P2-1, P1-2, and P2-2 may include a seed pattern 10 (FIG. 6) and an electroplating layer 30 (FIG. 6). The seed pattern may be formed from a seed layer 10' (FIG. 2, etc.), which will be described later. The seed layer 10' (FIG. 2, etc.) may be formed by, for example, at least one of a sputtering method, an electroless plating method, and a metal film lamination method. An example of the seed layer 10' (FIG. 2, etc.) may include, but not limited to, an electroless copper plating layer formed as a single layer on one surface of the base B, a copper film layer formed as a single layer on one surface of the base B, or a multilayer structure formed on one surface of the base B through at least two of the above-described methods. The electroplating layer 30 (FIG. 6) may be formed through electroplating using the seed layer 10' (FIG. 2, etc.) as a seed. The electroplating layer 30 (FIG. 6) may be, for example, an electrolytic copper plating layer, but is not limited thereto. The electroplating layer (FIG. 6) may be formed in a single-layer structure by performing electroplating one time, or formed in a multilayer structure including at least two layers by performing electroplating at least two times.

Each of average line widths $W_{P1-1}$, $W_{P1-2}$, $W_{P2-1}$, and $W_{P2-2}$ of the 1-1st, 1-2nd, 2-1st, and 2-2nd conductor patterns P1-1, P1-2, P2-1, and P2-2 may be 0.5 µm or more and 5 µm or less.

Here, the average line width $W_{P1-1}$ of the 1-1st conductor pattern P1-1 may refer to, for example, a maximum value among respective dimensions of a plurality of line segments of the 1-1st conductor pattern P1-1, the plurality of line segments being spaced apart from each other in a thickness direction T while each connecting two outermost boundary lines facing each other in a width direction W to each other, based on an optical photograph or an SEM photograph of a width direction W-thickness direction T cross section (WT cross section) of the board taken from a central portion of the board in a length direction L. Alternatively, the average line width $W_{P1-1}$ of the 1-1st conductor pattern P1-1 may refer to a minimum value among respective dimensions of a plurality of line segments of the 1-1st conductor pattern P1-1, the plurality of line segments being spaced apart from each other in the thickness direction T while each connecting two outermost boundary lines facing each other in the width direction W to each other, based on the above-described photograph of the cross section of the board. Alternatively, the average line width $W_{P1-1}$ of the 1-1st conductor pattern P1-1 may refer to an arithmetic mean value of at least two of respective dimensions of a plurality of line segments of the 1-1st conductor pattern P1-1, the plurality of line segments being spaced apart from each other in the thickness direction T while each connecting two outermost boundary lines facing each other in the width direction W to each other, based on the above-described photograph of the cross section of the board. Meanwhile, the same is also applicable to each of the line widths $W_{P1-2}$, $W_{P2-1}$, and $W_{P2-2}$ of the 1-2nd, 2-1st, and 2-2nd conductor patterns P1-2, P2-1, and P2-2.

Each of an average space $S_1$ between the 1-1st conductor pattern P1-1 and the 2-1st conductor pattern P2-1, an average space $S_2$ between the 2-1st conductor pattern P2-1 and the 1-2nd conductor pattern P1-2, and an average space $S_3$ between the 1-2nd conductor pattern P1-2 and the 2-2nd conductor pattern P2-2 may be 5 µm or more and 5 µm or less.

Here, the average space $S_1$ between the 1-1st conductor pattern P1-1 and the 2-1st conductor pattern P2-1 may refer to, for example, a maximum value among respective dimensions of a plurality of line segments of the space between the 1-1st conductor pattern P1-1 and the 2-1st conductor pattern P2-1, the plurality of line segments being spaced apart from each other in the thickness direction T while each connecting two outermost boundary lines facing each other in the width direction W to each other, based on an optical photograph or an SEM photograph of a width direction W-thickness direction T cross section (WT cross section) of the board taken from a central portion of the board in the length direction L. Alternatively, the average space $S_1$ between the 1-1st conductor pattern P1-1 and the 2-1st conductor pattern P2-1 may refer to a minimum value among respective dimensions of a plurality of line segments of the space between the 1-1st conductor pattern P1-1 and the 2-1st conductor pattern P2-1, the plurality of line segments being spaced apart from each other in the thickness direction T while each connecting two outermost boundary lines facing each other in the width direction W to each other, based on the above-described photograph of the cross section of the board. Alternatively, the average space $S_1$ between the 1-1st conductor pattern P1-1 and the 2-1st conductor pattern P2-1 may refer to an arithmetic mean value of at least two of respective dimensions of a plurality of line segments of the space between the 1-1st conductor pattern P1-1 and the 2-1st conductor pattern P2-1, the plurality of line segments being spaced apart from each other in the thickness direction T while each connecting two outermost boundary lines facing each other in the width direction W to each other, based on the above-described photograph of the cross section of the board. Meanwhile, the same is also applicable to each of the average space $S_2$ between the 2-1st conductor pattern P2-1 and the 1-2nd conductor pattern P1-2 and the average space $S_3$ between the 1-2nd conductor pattern P1-2 and the 2-2nd conductor pattern P2-2.

Each of heights $H_{P1-1}$, $H_{P1-2}$, $H_{P2-1}$, and $H_{P2-2}$ of the 1-1st, 1-2nd, 2-1st, and 2-2nd conductor patterns P1-1, P1-2, P2-1, and P2-2 may be 2.5 µm or more and 5 µm or less.

The height $H_{P1-1}$ of the 1-1st conductor pattern P1-1 may refer to, for example, a maximum value among respective dimensions of a plurality of line segments of the 1-1st conductor pattern P1-1, the plurality of line segments being spaced apart from each other in the width direction W while each connecting two outermost boundary lines facing each other in the thickness direction T to each other, based on an optical photograph or an SEM photograph of a width direction W-thickness direction T cross section (WT cross section) of the board taken from a central portion of the board in the length direction L. Alternatively, the height $H_{P1-1}$ of the 1-1st conductor pattern P1-1 may refer to a minimum value among respective dimensions of a plurality of line segments of the 1-1st conductor pattern P1-1, the plurality of line segments being spaced apart from each other in the width direction W while each connecting two outermost boundary lines facing each other in the thickness direction T to each other, based on the above-described photograph of the cross section of the board. Alternatively, the height $H_{P1-1}$ of the 1-1st conductor pattern P1-1 may refer to an arithmetic mean value of at least two of respective dimensions of a plurality of line segments of the 1-1st conductor pattern P1-1, the plurality of line segments being spaced apart from each other in the width direction W while each connecting two outermost boundary lines facing each other in the thickness direction T to each other, based on the above-described photograph of the cross section of the board. Meanwhile, the same is also applicable to each of the heights $H_{P1-2}$, $H_{P2-1}$, and $H_{P2-2}$ of the 1-2nd, 2-1st, and 2-2nd conductor patterns P1-2, P2-1, and P2-2.

i-1) A ratio $W_{P1-1}/W_{P1-2}$ of the line width $W_{P1-1}$ of the 1-1st conductor pattern P1-1 to the line width $W_{P1-2}$ of the 1-2nd conductor pattern P1-2 may be more than 0.9 and less than 1.1. A ratio $W_{P2-1}/W_{P2-2}$ of the line width $W_{P2-1}$ of the 2-1st conductor pattern P2-1 to the line width $W_{P2-2}$ of the 2-2nd conductor pattern P2-2 may be more than 0.9 and less than 1.1. Also, i-2) a value obtained by dividing an absolute value of a difference between the line width $W_{P1-1}$ of the 1-1st conductor pattern P1-1 and the line width $W_{P2-1}$ of the 2-1st conductor pattern P2-1 by the line width $W_{P1-1}$ of the 1-1st conductor pattern P1-1 may be more than 0.1. In the present exemplary embodiment, both the above-described conditions i-1) and i-2) may be satisfied. When the above-described conditions i-1) and/or i-2) are satisfied, even though openings O1-1, O1-2, O2-1, and O2-2 (FIG. 4) of a plating resist layer are formed in different exposure steps, a single conductor pattern layer including conductor patterns having similar line widths can be formed.

In addition, ii-1) a ratio $S_1/S_3$ of the average space $S_1$ between the 1-1st conductor pattern P1-1 and the 2-1st conductor pattern P2-1 to the average space $S_3$ between the 1-2nd conductor pattern P1-2 and the 2-2nd conductor pattern P2-2 may be more than 0.9 and less than 1.1. Also, ii-2) a value obtained by dividing an absolute value of a difference between the space $S_2$ between the 2-1st conductor pattern P2-1 and the 1-2nd conductor pattern P1-2 and the space $S_1$ between the 1-1st conductor pattern P1-1 and the 2-1st conductor pattern P2-1 by the space $S_1$ between the 1-1st conductor pattern P1-1 and the 2-1st conductor pattern P2-1 may be more than 0.1. In the present exemplary embodiment, both the above-described conditions ii-1) and ii-2) may be satisfied. When the above-described conditions ii-1) and/or ii-2) are satisfied, even though openings O1-1, O1-2, O2-1, and O2-2 (FIG. 4) of a plating resist layer are formed in different exposure steps, a single conductor pattern layer including conductor patterns having similar average spaces can be formed.

In addition, iii-1) a ratio $H_{P1-1}/H_{P1-2}$ of the height $H_{P1-1}$ of the 1-1st conductor pattern P1-1 to the height $H_{P1-2}$ of the 1-2nd conductor pattern P1-2 may be more than 0.9 and less than 1.1. A ratio $H_{P2-1}/H_{P2-2}$ of the height $H_{P2-1}$ of the 2-1st conductor pattern P2-1 to the height $H_{P2-2}$ of the 2-2nd conductor pattern P2-2 may be more than 0.9 and less than 1.1. Also, iii-2) a value obtained by dividing an absolute value of a difference between the height $H_{P1-1}$ of the 1-1st conductor pattern P1-1 and the height $H_{P2-1}$ of the 2-1st conductor pattern P2-1 by the height $H_{P1-1}$ of the 1-1st conductor pattern P1-1 may be more than 0.1. In the present exemplary embodiment, both the above-described conditions iii-1) and iii-2) may be satisfied. When the above-described conditions iii-1) and/or iii-2) are satisfied, even though openings O1-1, O1-2, O2-1, and O2-2 (FIG. 4) of a plating resist layer are formed in different exposure steps, a single conductor pattern layer including conductor patterns having similar average heights can be formed.

In addition, a ratio of each of the spaces $S_1$, $S_2$, and $S_3$ between the conductor patterns P1-1, P1-2, P2-1, and P2-2 with respect to an average height (average of $H_{P1-1}$, $H_{P1-2}$, $H_{P2-1}$, and $H_{P2-2}$) of the first-group conductor patterns P1-1 and P1-2 and the second-group conductor patterns P2-1 and P2-2 may be more than ¼ and less than ⅗. For example, a value obtained by dividing the space $S_1$ between the 1-1st conductor pattern P1-1 and the 2-1st conductor pattern P2-1 by the average height of the first-group conductor patterns P1-1 and P1-2 and the second-group conductor patterns P2-1 and P2-2 may be more than ¼ and less than ⅗. A value obtained by dividing the space $S_2$ between the 2-1st conductor pattern P2-1 and the 1-2nd conductor pattern P1-2 by the average height of the first-group patterns and the second-group patterns may be more than ¼ and less than ⅗. A value obtained by dividing the space $S_3$ between the 1-2nd conductor pattern P1-2 and the 2-2nd conductor pattern P2-2 by the average height of the first-group patterns and the second-group patterns may be more than ¼ and less than ⅗. In this case, a plurality of conductor patterns can be formed in a relatively narrow space, thereby increasing wiring density.

In addition, a ratio of each of the line widths $W_{P1-1}$, $W_{P1-2}$, $W_{P2-1}$, and $W_{P2-2}$ of the conductor patterns P1-1, P1-2, P2-1, and P2-2 with respect to an average height (average of $H_{P1-1}$, $H_{P1-2}$, $H_{P2-1}$, and $H_{P2-2}$) of the first-group conductor patterns P1-1 and P1-2 and the second-group conductor patterns P2-1 and P2-2 may be more than 5/16 and less than 9/20. For example, a value obtained by dividing the line width $W_{P1-1}$ of the 1-1st conductor pattern P1-1 by the average height (average of $H_{P1-1}$, $H_{P1-2}$, $H_{P2-1}$, and $H_{P2-2}$) of the first-group conductor patterns P1-1 and P1-2 and the second-group conductor patterns P2-1 and P2-2 may be more than 5/16 and less than 9/20. A value obtained by dividing the line width $W_{P1-2}$ of the 1-2nd conductor pattern P1-2 by the average height (average of $H_{P1-1}$, $H_{P1-2}$, $H_{P2-1}$, and $H_{P2-2}$) of the first-group conductor patterns P1-1 and P1-2 and the second-group conductor patterns P2-1 and P2-2 may be more than 5/16 and less than 9/20. A value obtained by dividing the line width $W_{P2-1}$ of the 2-1st conductor pattern P2-1 by the average height (average of $H_{P1-1}$, $H_{P1-2}$, $H_{P2-1}$, and $H_{P2-2}$) of the first-group conductor patterns P1-1 and P1-2 and the second-group conductor patterns P2-1 and P2-2 may be more than 5/16 and less than 9/20. A value obtained by dividing the line width $W_{P2-2}$ of the 2-2nd conductor pattern P2-2 by the average height (average of $H_{P1-1}$, $H_{P1-2}$, $H_{P2-1}$, and $H_{P2-2}$) of the first-group conductor patterns P1-1 and P1-2 and the second-group conductor patterns P2-1 and P2-2 may be more than 5/16 and less than 9/20. In this case, a ratio of the line width to the height (line width/height=W/H; aspect ratio; A/R) of each of the conductor patterns P1-1, P1-2, P2-1, and P2-2 can be small, and accordingly, a plurality of conductor patterns can be formed in a relatively narrow space.

In addition, a ratio of any one of $W_{P1-1}$, $W_{P1-2}$, $W_{P2-1}$, and $W_{P2-2}$ to any one of $S_1$, $S_2$, and $S_3$ may be more than 0.33 and less than 2, and preferably 0.5 or more and 1.4 or less. For example, a ratio of each of $W_{P1-1}$, $W_{P1-2}$, $W_{P2-1}$, and $W_{P2-2}$ to $S_1$ may be more than 0.33 and less than 2, and preferably 0.5 or more and 1.4 or less. A ratio of each of $W_{P1-1}$, $W_{P1-2}$, $W_{P2-1}$, and $W_{P2-2}$ to $S_2$ may be more than 0.33 and less than 2, and preferably 0.5 or more and 1.4 or less. A ratio of each of $W_{P1-1}$, $W_{P1-2}$, $W_{P2-1}$, and $W_{P2-2}$ to $S_3$ may be more than 0.33 and less than 2, and preferably 0.5 or more and 1.4 or less.

In addition, a ratio of any one of $H_{P1-1}$, $H_{P1-2}$, $H_{P2-1}$, $H_{P2-2}$, and the average height of the patterns to any one of $S_1$, $S_2$, and $S_3$ may be more than 1.33 and less than 2.33, and preferably 1.66 or more and 2 or less. For example, a ratio of each of $H_{P1-1}$, $H_{P1-2}$, $H_{P2-1}$, $H_{P2-2}$, and the average height of the patterns to $S_1$ may be more than 1.33 and less than 2.33, and preferably 1.66 or more and 2 or less. A ratio of each of $H_{P1-1}$, $H_{P1-2}$, $H_{P2-1}$, $H_{P2-2}$, and the average height of the patterns to $S_2$ may be more than 1.33 and less than 2.33, and preferably 1.66 or more and 2 or less. A ratio of each of $H_{P1-1}$, $H_{P1-2}$, $H_{P2-1}$, $H_{P2-2}$, and the average height of the patterns to $S_3$ may be more than 1.33 and less than 2.33, and preferably 1.66 or more and 2 or less.

The insulating layer IL may be formed on the base B to cover the conductor pattern layer including the plurality of conductor patterns P1-1, P2-1, P1-2, and P2-2. The insulating layer IL may be formed by laminating film-type subsidiary materials such as a prepreg (PPG), an Ajinomoto build-up film (ABF), and a photo imageable dielectric (PID), or may be formed by applying a liquid insulating material.

FIGS. 2 to 6 are views sequentially illustrating examples of a method of manufacturing the printed circuit board illustrated in FIG. 1.

Figure 2:
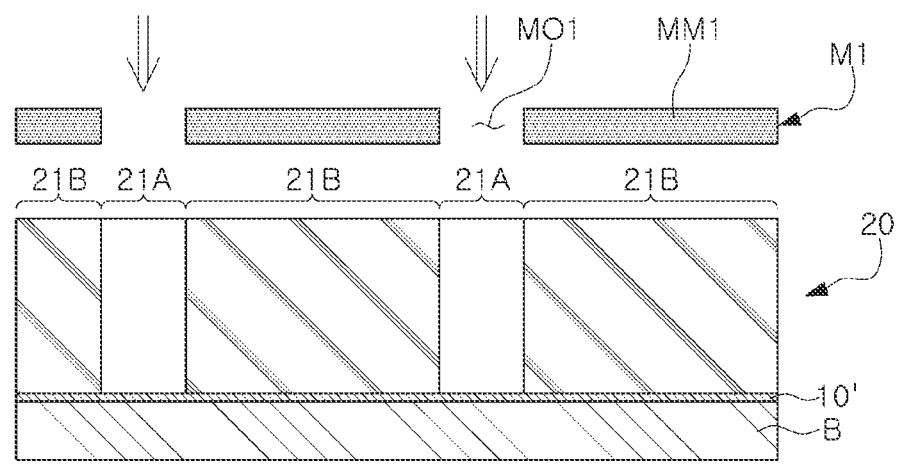
FIGS. 2 to 6 are views sequentially illustrating examples of a method of manufacturing the printed circuit board illustrated in FIG. 1.

First, referring to FIG. 2, a seed layer may be formed on a base, a plating resist layer may be disposed on the seed layer, and first areas of the plating resist layer may be exposed using a first mask.

The base B may include at least one of conductor pattern layers, interlayer insulating layers each disposed between adjacent ones of the conductor pattern layers in the thickness direction, and a via penetrating through at least one of the interlayer insulating layers to connect the adjacent conductor pattern layers to each other. When it is assumed as an example that the printed circuit board 1000 according to the present exemplary embodiment includes a total of four conductor pattern layers, a total of three insulating layers each disposed between adjacent ones of the conductor pattern layers, two solder resist layers formed on outermost ones of the insulating layers, respectively, and a via penetrating through at least one of the insulating layers, a conductor layer to be described later may be, for example, an uppermost conductor pattern layer, and the base B may include a total of three conductor pattern layers, a total of three insulating layers, a lowermost solder resist layer, and a via, all of which are disposed below the uppermost conductor pattern layer.

The seed layer 10' may be disposed on one surface of the base B. The seed layer 10' may be formed by, for example, at least one of a sputtering method, an electroless plating method, and a metal film lamination method. An example of the seed layer 10' may include, but not limited to, an electroless copper plating layer formed as a single layer on one surface of the base B, a metal film layer formed as a single layer on one surface of the base B, or a multilayer structure formed on one surface of the base B through at least two of the above-described methods. The seed layer 10' may include, for example, at least one of an electroless copper plating layer containing copper (Cu) and a copper film, but is not limited thereto.

The plating resist layer 20 may be formed by, for example, laminating a film-type material including a photosensitive material, such as a dry film, on one surface of the base B on which the seed layer 10' is formed, or applying a liquid photosensitive material onto one surface of the base B on which the seed layer 10' is formed, but is not limited thereto. The plating resist layer 20 may include, for example, a positive-type photosensitive material, but is not limited thereto, and may include a negative-type photosensitive material. However, for convenience of description, the following description will be made on the assumption that the plating resist layer 20 includes a positive-type photosensitive material.

The first mask M1 may have first masking areas MM1 which are closed areas each corresponding to a space (which refers to a sum of $S_1$, $W_{P2-1}$, and $S_2$ in FIG. 1) between the first-group conductor patterns P1-1 and P1-2, and first opening areas MO1 which are opened areas corresponding to the first-group conductor patterns P1-1 and P1-2, respectively. Light may be irradiated through the first opening areas MO1 of the first mask M1, such that the first areas 21A of the plating resist layer 20 are exposed to the light (first exposure step). After the first exposure step, the plating resist layer 20 has first exposed areas 21A and first non-exposed areas 21B, which are spaces between the first exposed areas 21A. The first non-exposed area 21B may be three times wider than the first exposed area 21A, but is not limited thereto.

Figure 3:
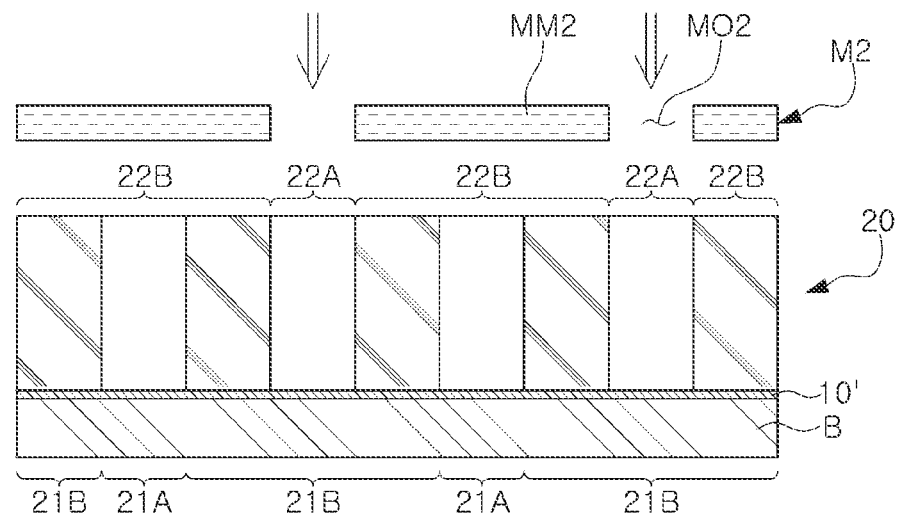

Next, referring to FIG. 3, second areas of the plating resist layer, which are spaces between the first areas, are exposed using a second mask.

The second mask M2 may have second masking areas MM2 which are closed areas each corresponding to a space (which refers to a sum of $S_2$, $W_{P1-2}$, and $S_3$ in FIG. 1) between the second-group conductor patterns P2-1 and P2-2, and second opening areas MO2 which are opened areas corresponding to the second-group conductor patterns P2-1 and P2-2, respectively. Light may be irradiated through the second opening areas MO2 of the second mask M2, such that the second areas 22A of the plating resist layer 20 are exposed to the light (second exposure step). After the second exposure step, the plating resist layer 20 has second exposed areas 22A and second non-exposed areas 22B, which are spaces between the second exposed areas 22A. The second non-exposed area 22B may be three times wider than the second exposed area 22A, but is not limited thereto. Meanwhile, the second non-exposed areas 22B, which are spaces between the second exposed areas 22A of the plating resist layer 20, may include all of the first areas 21A of the plating resist layer 20 exposed in the first exposure step, and may partially include the first non-exposed areas 21B, which are spaces that are not exposed in the first exposure step between the first areas 21A of the plating resist layer 20.

Figure 4:
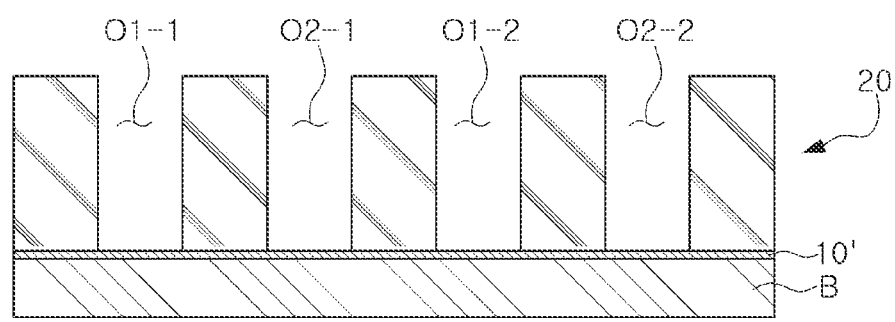

Next, referring to FIG. 4, the plating resist layer may be developed to form first and second openings spaced apart from each other in the first and second areas.

By developing the plating resist layer 20, the areas of the plating resist layer 20 exposed in at least one of the first and second exposure steps, that is, the first and second areas 21A and 22A may be removed. As a result, the plating resist layer 20 may have first openings O1-1 and O1-2 formed by removing the first areas 21A, and second openings O2-1 and O2-2 formed by removing the second areas 22A. Consequently, after being developed, the plating resist layer 20 may remain only in a space between the first openings including a 1-1st opening O1-1 and a 1-2nd opening O1-2 spaced apart from each other and a space between the second openings including a 2-1st opening O2-1 and a 2-2nd opening O2-2 spaced apart from each other. Here, the 2-1st opening O2-1 may be disposed between the 1-1st opening O1-1 and the 1-2nd opening O1-2, and the 1-2nd opening O1-2 may be disposed between the 2-1st opening O2-1 and the 2-2nd opening O2-2. The first-group conductor patterns P1-1 and P1-2 and the second-group conductor patterns P2-1 and P2-2, which will be described later, may be formed in the first and second openings O1-1, O1-2, O2-1, and O2-2. The first and second openings O1-1, O1-2, O2-1, and O2-2 expose the seed layer 10' to the outside.

Respective average widths of the first and second openings O1-1, O1-2, O2-1, and O2-2 may be substantially the same as the average line widths $W_{P1-1}$, $W_{P1-2}$, $W_{P2-1}$, and $W_{P2-2}$ of the 1-1st, 1-2nd, 2-1st, and 2-2nd conductor patterns P1-1, P1-2, P2-1, and P2-2, which are described above. Respective average spaces between the first and second openings O1-1, O1-2, O2-1, and O2-2 may be substantially the same as the average space $S_1$ between the 1-1st conductor pattern P1-1 and the 2-1st conductor pattern P2-1, the average space $S_2$ between the 2-1st conductor pattern P2-1 and the 1-2nd conductor pattern P1-2, and the average space $S_3$ between the 1-2nd conductor pattern P1-2 and the 2-2nd conductor pattern P2-2, which are described above.

Figure 5:
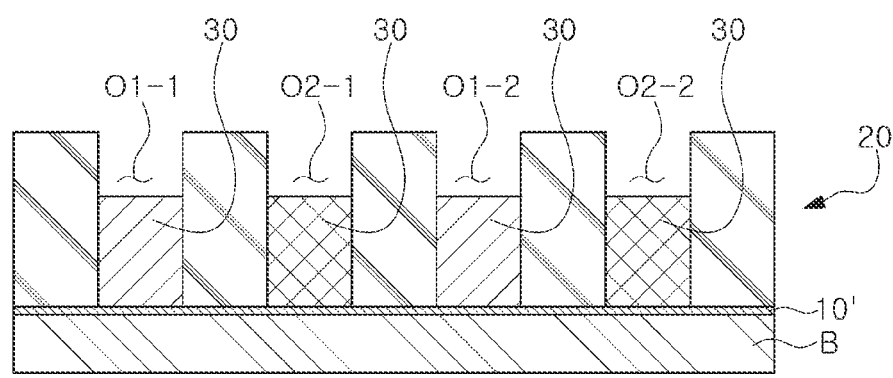

Next, referring to FIG. 5, the first and second openings of the plating resist layer may be filled with conductors.

The conductors filling the first and second openings O1-1, O1-2, O2-1, and O2-2 together with the seed layer 10' disposed thereunder may form the above-described first-group and second-group conductor patterns P1-1, P1-2, P2-1, and P2-2 through a subsequent step. The first and second openings O1-1, O1-2, O2-1, and O2-2 may be filled with conductors, for example, by electroplating using the seed layer 10' exposed through the first and second openings O1-1, O1-2, O2-1, and O2-2. In this case, the conductors filling the first and second openings O1-1, O1-2, O2-1, and O2-2 may form the plating layer 30 through electroplating. The electroplating layer 30 may be, for example, an electrolytic copper plating layer, but is not limited thereto. The electroplating layer 30 may be formed in a single-layer structure by performing electroplating one time, or formed in a multilayer structure including at least two layers by performing electroplating at least two times.

Next, referring to FIG. 6, the resist layer may be removed, and partial areas of the seed layer, where the plating layer is not formed, may be removed.

The resist layer 20 may be removed with, for example, a stripping solution such as sodium hydroxide. The partial areas (areas where the plating layer 30 is not formed) of the seed layer 10' exposed to the outside resulting from the removal of the plating resist layer may be removed through flash etching or half etching. By partially removing the seed layer 10', seed patterns 10 may be formed. In this way, the conductor pattern layer including the first-group and second-group conductor patterns P1-1, P1-2, P2-1, and P2-2 illustrated in FIG. 1 may be formed.

Meanwhile, although not illustrated, an insulating layer may be formed after the step of FIG. 6.

The insulating layer IL may be formed by laminating film-type subsidiary materials such as a prepreg (PPG), an Ajinomoto build-up film (ABF), and a photo imageable dielectric (PID), or may be formed by applying a liquid insulating material.

In the present exemplary embodiment, when forming a single conductor pattern layer using the plating resist layer 20, the first and second areas 21A and 22A of the resist layer 20 may be dividedly exposed by performing exposure with respect to the single resist layer 20 at least two times with different exposure areas, and then the first and second openings O1-1, O1-2, O2-1, and O2-2 of the plating resist layer 20 may be formed in a lump. Therefore, in the present exemplary embodiment, a narrow pitch and a narrow space, which cannot be achieved by one-time exposure and plating, can be achieved without using exposure equipment having relatively excellent exposure performance, that is, even in the case that conventional exposure equipment is used. For example, assuming that the conventional exposure equipment has a minimum resolution of 5 µm, in a case where a conductor pattern layer is formed using a plating resist layer that is formed by performing exposure one time, a minimum space between conductor patterns of the conductor pattern layer may be 5 µm or more. However, in the present exemplary embodiment, even though the same exposure equipment having a minimum resolution of 5 µm is used, the minimum space between the conductor patterns can be implemented to be smaller than 5 µm, which is the above-described limit of the exposure equipment in terms of resolution, by performing exposure multiple times with different exposure areas.

Figure 7:
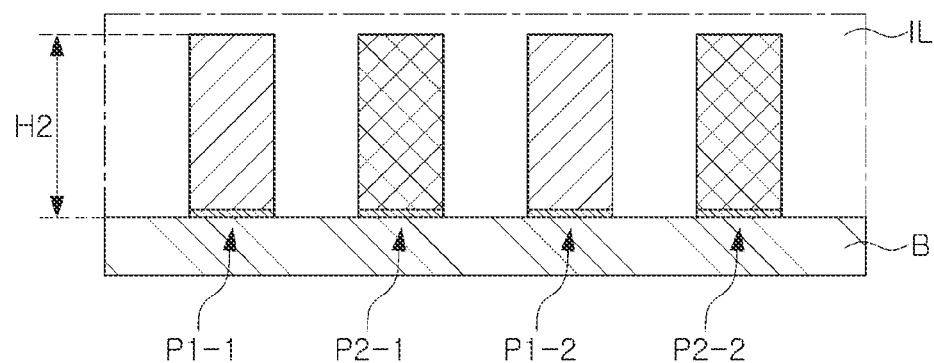
FIG. 7 is a view schematically illustrating a portion of a printed circuit board according to another exemplary embodiment of the present disclosure.

FIG. 7 is a view schematically illustrating a portion of a printed circuit board according to another exemplary embodiment of the present disclosure. FIGS. 8 to 11 are views sequentially illustrating examples of a method of manufacturing the printed circuit board illustrated in FIG. 7.

When FIGS. 7 to 11 are compared with FIGS. 1 to 6, a printed circuit board 2000 and a method of manufacturing the same according to the present exemplary embodiment are different, in terms of a step of forming a plating layer, from the printed circuit board 1000 and the method of manufacturing the same according to an exemplary embodiment of the present disclosure, resulting in a difference in height H2 of the conductor patterns P1-1, P1-2, P2-1, and P2-2. Therefore, in connection with the printed circuit board 2000 and the method of manufacturing the same according to the present exemplary embodiment, only the step of forming a plating layer, which is different from that in an exemplary embodiment of the present disclosure, will be described. For the other configurations in the present exemplary embodiment, the description of those in an exemplary embodiment of the present disclosure may be identically applied.

Figure 8:
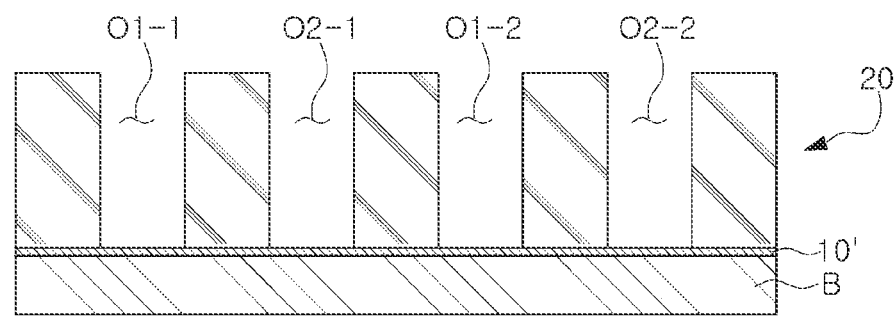
FIGS. 8 to 11 are views sequentially illustrating examples of a method of manufacturing the printed circuit board illustrated in FIG. 7.

In the present exemplary embodiment, first, a plating resist layer having first and second openings as illustrated in FIG. 8 may be formed on one surface of the base after performing the steps of FIGS. 2 to 4.

Figure 9:
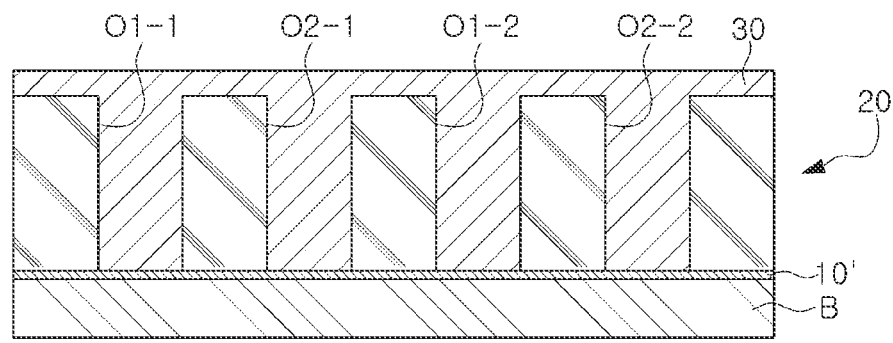

Next, as illustrated in FIG. 9, over-plating may be performed so that a plating layer exceeds a thickness of the resist layer.

In the present exemplary embodiment, unlike in an exemplary embodiment of the present disclosure, over-plating may be performed so that the electroplating layer 30 filling the first and second openings O1-1, O1-2, O2-1, and O2-2 is higher than the resist layer 20, for example, by adjusting an electroplating time and a current density.

Figure 10:
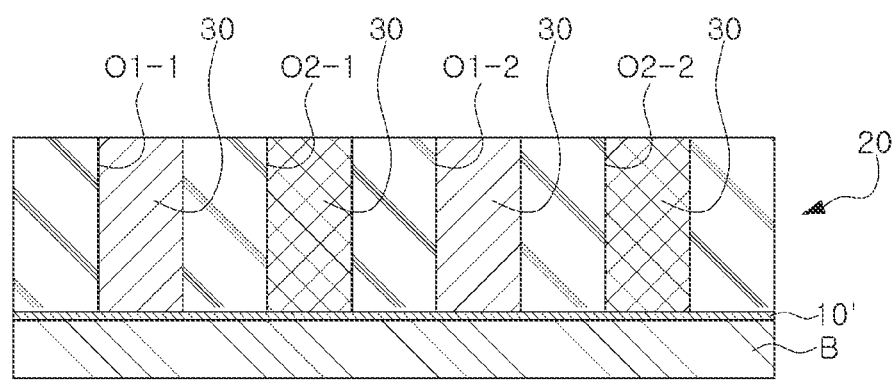

Next, as illustrated in FIG. 10, an area of the plating layer higher than an upper surface of the plating resist layer, that is, an over-plated area of the plating layer, may be removed by polishing.

The polishing may be performed using at least one of physical polishing, chemical polishing, and physicochemical polishing. For example, the polishing may be performed through half etching, but the scope of the present disclosure is not limited thereto.

Figure 11:
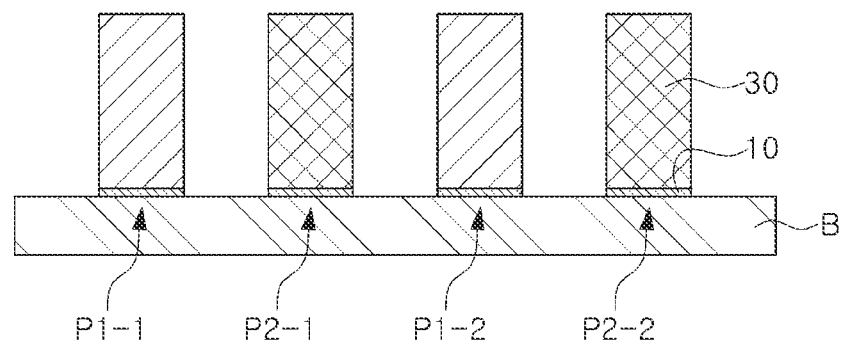

Next, referring to FIG. 11, the resist layer may be removed, and partial areas of the seed layer, where the plating layer is not formed, may be removed.

This step may be the same as that of FIG. 6 in an exemplary embodiment of the present disclosure.

Meanwhile, although not illustrated, an insulating layer may be formed after the step of FIG. 11.

In the present exemplary embodiment, the plating layer 30 may be formed by removing the over-plated area of the plating layer after the over-plating. Accordingly, the height H2 of the conductor patterns P1-1, P1-2, P2-1, and P2-2 in the present exemplary embodiment may be greater than the heights $H_{P1-1}$, $H_{P1-2}$, $H_{P2-1}$, and $H_{P2-2}$ of the conductor patterns P1-1, P1-2, P2-1, and P2-2 in an exemplary embodiment of the present disclosure. Consequently, in the present exemplary embodiment, it is possible to increase a proportion of conductors within the same cross-sectional area, thereby improving wiring density.

Figure 12:
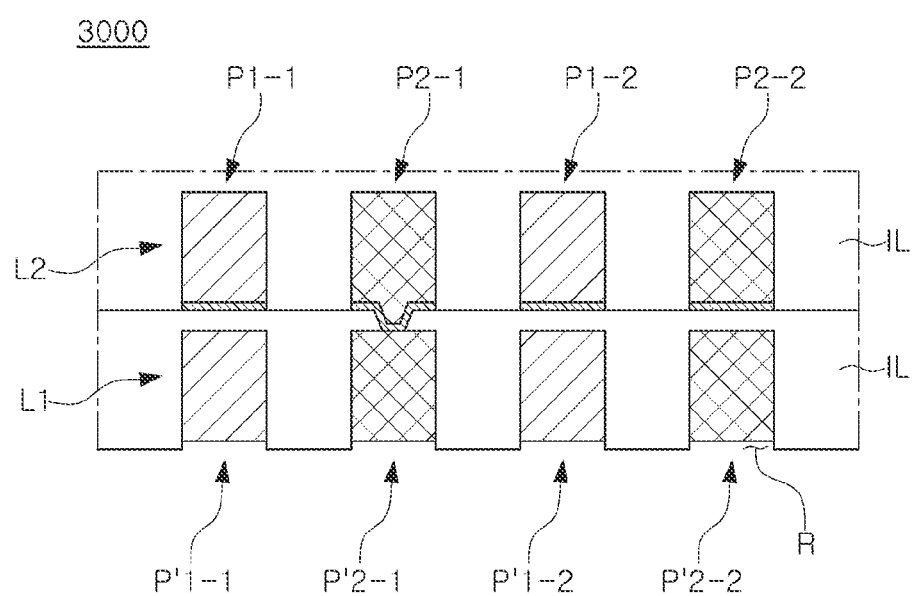
FIG. 12 is a view schematically illustrating a portion of a printed circuit board according to another exemplary embodiment of the present disclosure.

FIG. 12 is a view schematically illustrating a portion of a printed circuit board according to another exemplary embodiment of the present disclosure. FIGS. 13 to 21 are views sequentially illustrating examples of a method of manufacturing the printed circuit board illustrated in FIG. 12.

When FIGS. 12 to 21 are compared with FIGS. 1 to 6, a printed circuit board 3000 and a method of manufacturing the same according to the present exemplary embodiment are different, in terms of a connection relationship between a first conductor pattern layer L1 and a first insulating layer IL, from the printed circuit board 1000 and the method of manufacturing the same according to an exemplary embodiment of the present disclosure. Therefore, in connection with the printed circuit board 3000 and the method of manufacturing the same according to the present exemplary embodiment, only the step of forming a first conductor pattern layer L1 and a first insulating layer IL, which is different from that in an exemplary embodiment of the present disclosure, will be described. For the other configurations in the present exemplary embodiment, the description of those in an exemplary embodiment of the present disclosure may be identically applied.

Figure 13:
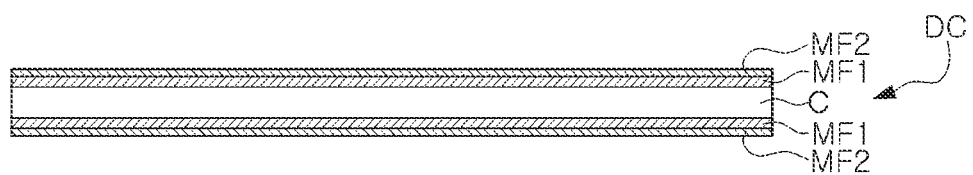
FIGS. 13 to 21 are views sequentially illustrating examples of a method of manufacturing the printed circuit board illustrated in FIG. 12.

First, as illustrated in FIG. 13, a detach core may be prepared.

The detach core DC may be formed by, for example, disposing a first metal layer MF1 on each of both surfaces of a core C, and disposing a second metal layer MF2 on the first metal layer MF1. The core C may be an insulating material formed by, for example, impregnating a woven glass cloth with an insulating resin. Each of the first and second metal layers MF1 and MF2 may be, for example, a copper film. The second metal layer MF2 may be thinner than the first metal layer MF1. One surface of the second metal layer MF2 contacting the first metal layer MF1 may be a shiny surface having a relatively low surface roughness. The other surface of the second metal layer MF2 opposite to one surface of the second metal layer MF2 may be a matte surface having a relatively high surface roughness. In the present exemplary embodiment, subsequent steps may be performed on the other surface that is the matte surface of the second metal layer MF2. Meanwhile, the method of manufacturing the printed circuit board according to the present exemplary embodiment will be described below, on the assumption that the steps to be described later are performed only on the second metal layer MF2 disposed on an upper surface of the core C based on the direction of FIGS. 13 and 14, etc. This is merely for convenience of illustration of the drawings and explanation, and the subsequent steps may also be identically performed on the other surface of a second metal layer MF2 disposed on a lower surface of the core C.

Figure 14:
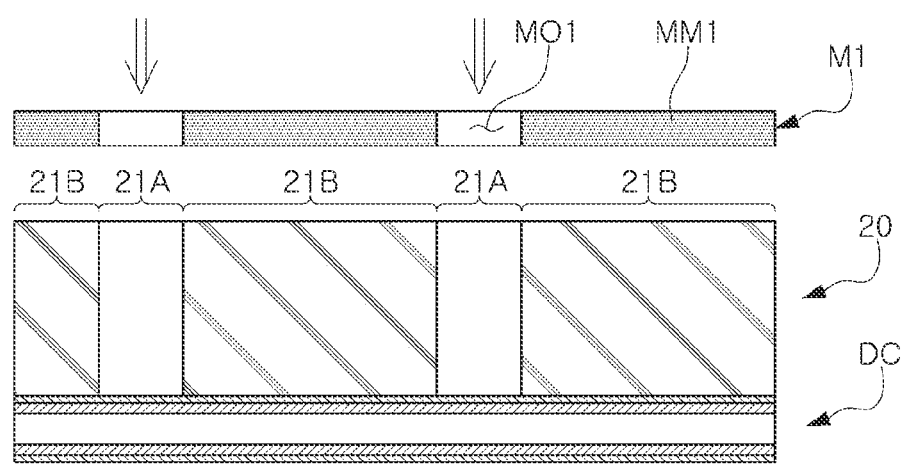

Next, as illustrated in FIG. 14, a plating resist layer may be disposed on the second metal layer, and first areas of the plating resist layer 20 may be exposed using a first mask.

This is the same as the step described with reference to FIG. 2, and thus, the detailed description thereof will be omitted.

Figure 15:
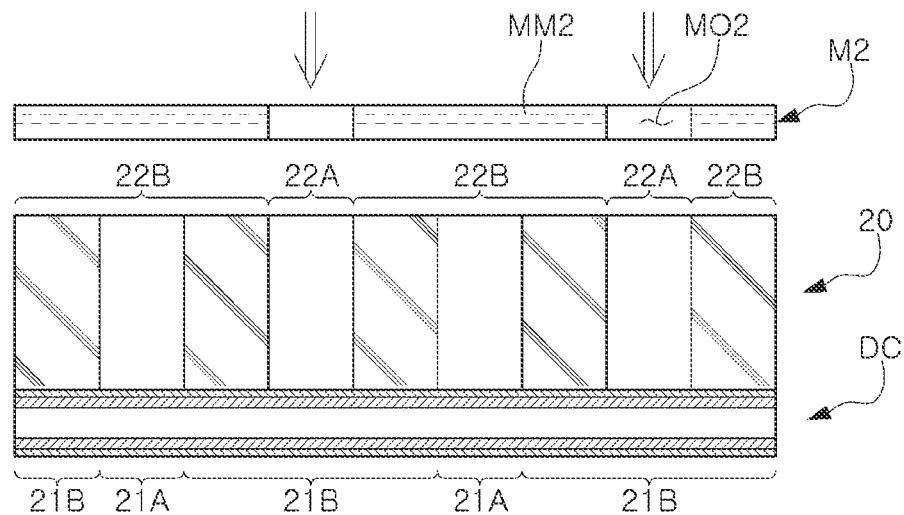

Next, as illustrated in FIG. 15, second areas of the plating resist layer, which are spaces between the first areas, may be exposed using a second mask.

This is the same as the step described with reference to FIG. 3, and thus, the detailed description thereof will be omitted.

Figure 16:
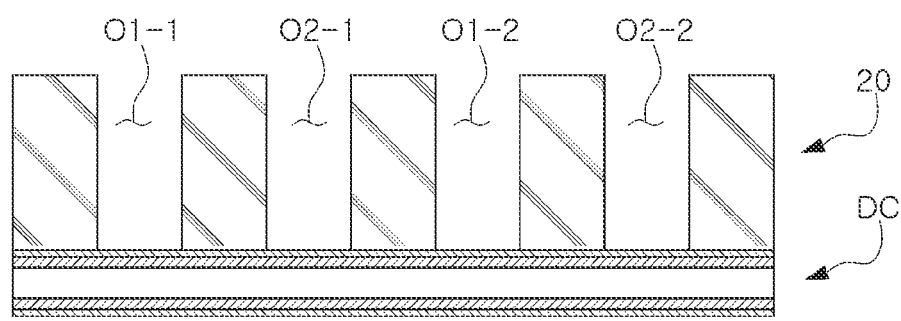

Next, as illustrated in FIG. 16, the plating resist layer may be developed to form first and second openings spaced apart from each other in the first and second areas.

This is the same as the step described with reference to FIG. 4, and thus, the detailed description thereof will be omitted.

Figure 17:
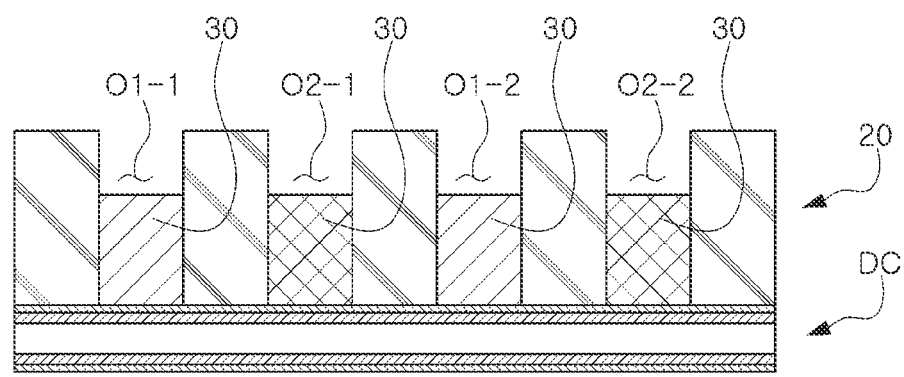

Next, referring to FIG. 17, the first and second openings of the plating resist layer may be filled with conductors.

This is the same as the step described with reference to FIG. 5, and thus, the detailed description thereof will be omitted.

Figure 18:
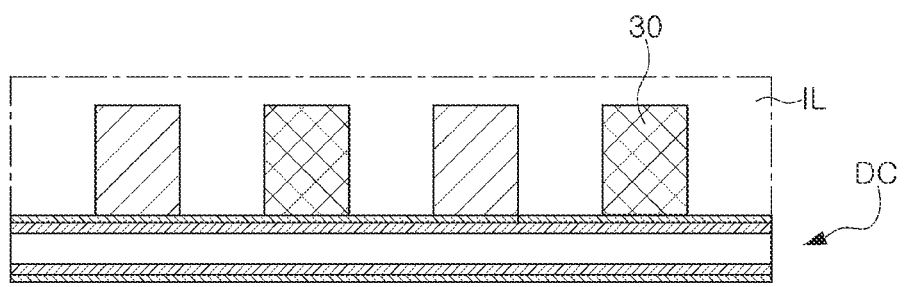

Next, referring to FIG. 18, the resist layer may be removed, and partial areas of the seed layer, where the plating layer is not formed, may be removed as in FIG. 6. Thereafter, an insulating layer may be formed on the other surface of the second metal layer MF2 to cover the first conductor pattern layer.

The insulating layer IL may be formed by laminating film-type subsidiary materials such as a prepreg (PPG), an Ajinomoto build-up film (ABF), and a photo imageable dielectric (PID), or may be formed by applying a liquid insulating material.

Figure 19:
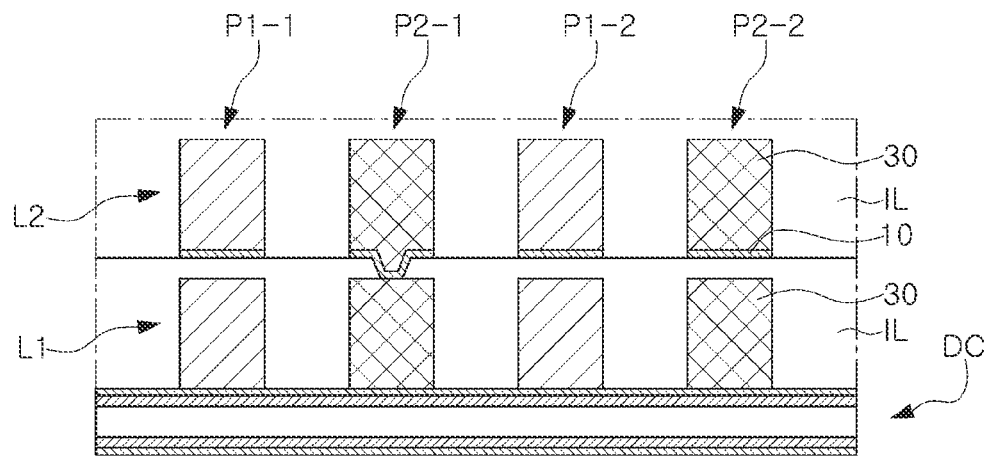

Next, referring to FIG. 19, a second conductor pattern layer and a second insulating layer may be formed by repeating the steps of FIGS. 14 to 18.

The second conductor pattern layer L2 may be formed by dividedly exposing the single plating resist layer 20 to form a plurality of openings and filling the openings through electroplating in the same manner as the above-described first conductor pattern layer L1. The second insulating layer IL may be formed using the same subsidiary materials or different subsidiary materials as/from the first insulating layer IL. Meanwhile, a via V connecting the first conductor pattern layer L1 and the second conductor pattern layer L2 to each other may be formed by forming an opening exposing at least a part of the plurality of conductor patterns of the first conductor pattern layer L1 in the first insulating layer IL using a laser or the like, and then filling the opening in the step for forming the second conductor pattern layer L2.

Figure 20:
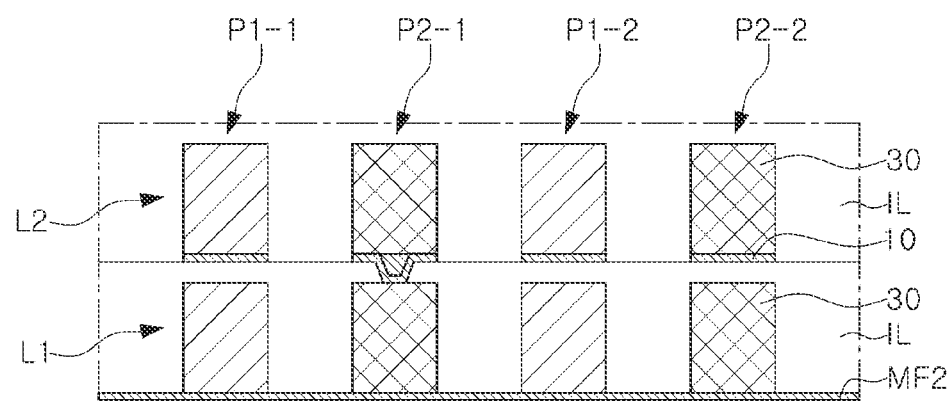

Next, referring to FIG. 20, the core of the detach core may be removed.

In the present exemplary embodiment, the core C, which is an insulating material, may be removed by removing the first metal layer MF1 and the core C from the second metal layer MF2. As described above, since one surface of the second metal layer MF2 contacting the first metal layer MF1 is a shiny surface having a relatively low surface roughness, the first metal layer MF1 and the second metal layer MF2 can be easily separated from each other at an interface thereof by an external force. Consequently, after this step, the second metal layer MF2 of the detach core DC remains attached onto a lower surface of the first insulating layer IL (based on the direction of FIG. 20).

Figure 21:
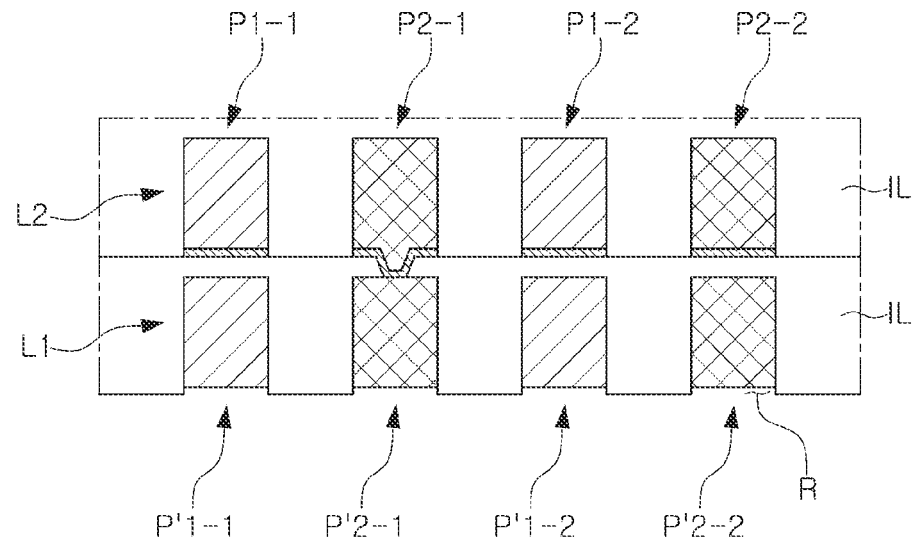

Next, referring to FIG. 21, the second metal layer may be removed from the first insulating layer.

The second metal layer MF2 may be removed from the lower surface of the first insulating layer IL by a chemical method such as flash etching or half etching. Meanwhile, when the second metal layer MF2 is an ultra-thin copper foil and the plating layer 30 of the first conductor pattern layer L1 is an electrolytic copper plating layer, the plating layer 30 of the first conductor pattern layer L1 may be partially removed together on a lower side thereof at the time of removing the second metal layer MF2 described above. Consequently, the lower surface of the first conductor pattern layer L1 may be positioned relatively higher than the lower surface of the first insulating layer IL. That is, recesses R may be formed in the lower surface of the first conductor pattern layer L1.

Figure 22:
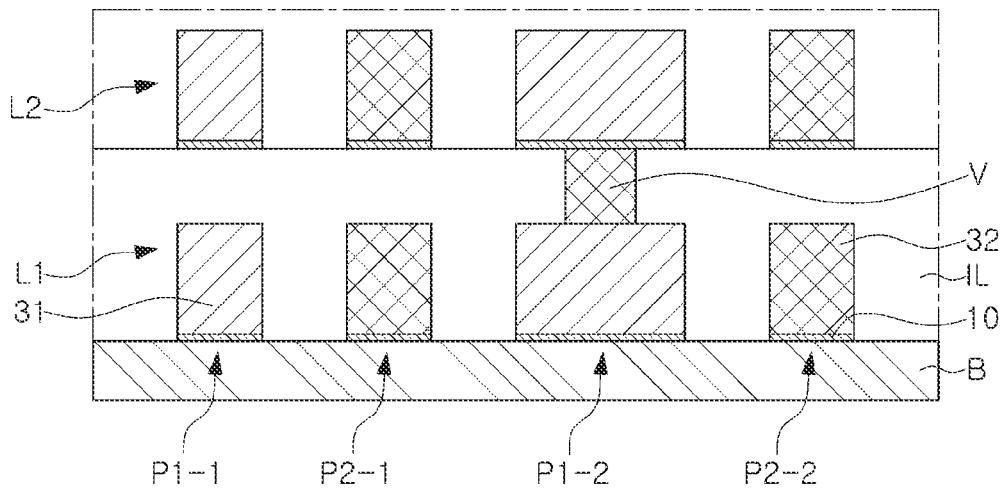
FIG. 22 is a view schematically illustrating a portion of a printed circuit board according to another exemplary embodiment of the present disclosure.

FIG. 22 is a view schematically illustrating a portion of a printed circuit board according to another exemplary embodiment of the present disclosure. FIGS. 23 to 30 are views sequentially illustrating examples of a method of manufacturing the printed circuit board illustrated in FIG. 22.

When FIGS. 23 to 30 are compared with FIGS. 1 to 6, a printed circuit board 4000 and a method of manufacturing the same according to the present exemplary embodiment are different, in terms of a step of forming a first conductor pattern layer L1, from the printed circuit board 1000 and the method of manufacturing the same according to an exemplary embodiment of the present disclosure. Therefore, in connection with the printed circuit board 4000 and the method of manufacturing the same according to the present exemplary embodiment, only the step of forming a first conductor pattern layer L1, which is different from that in an exemplary embodiment of the present disclosure, will be described. For the other configurations in the present exemplary embodiment, the description of those in an exemplary embodiment of the present disclosure may be identically applied.

First, the first areas of the first plating resist layer spaced apart from each other may be exposed through the step described with reference to FIG. 2.

Figure 23:
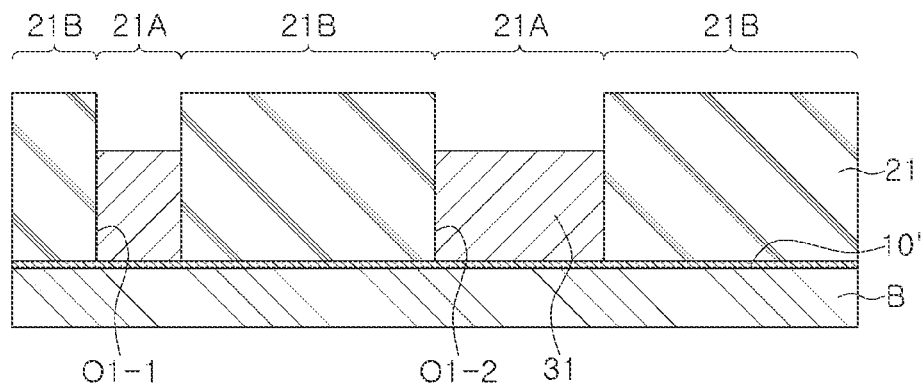
FIGS. 23 to 30 are views sequentially illustrating examples of a method of manufacturing the printed circuit board illustrated in FIG. 22.

Next, as illustrated in FIG. 23, the first plating resist layer may be developed to form first openings spaced apart from each other in the first plating resist layer, and the first openings may be filled with first plating patterns.

The first openings O1-1 and O1-2 may be formed by exposing first exposed areas 21A spaced apart from each other of the first plating resist layer 21 and then developing the first plating resist layer 21. First non-exposed areas 21B may be areas that are not exposed to light by an exposure mask.

Meanwhile, although it has been assumed in the above description that the first plating resist layer 21 includes a positive-type photosensitive material to remove exposed areas thereof when developed, this is merely an example, and the scope of the present disclosure is not limited thereto. That is, if the first plating resist layer 21 includes a negative-type photosensitive material, the first openings O1-1 and O1-2 may be formed by exposing the first non-exposed areas 21B of the first plating resist layer 21 illustrated in FIG. 23, and then developing the first plating resist layer 21. In this case, the first exposed areas 21A of the first plating resist layer 21 illustrated in FIG. 23 are not exposed to light, and may be removed at the time of development.

The first plating patterns 31 may be formed by electroplating using the seed layer 10' exposed through the first openings O1-1 and O1-2.

Figure 24:
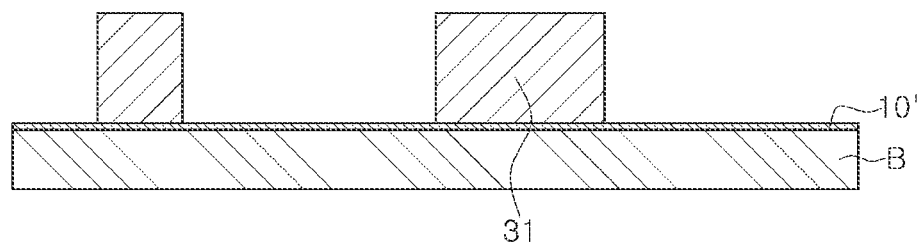

Next, as illustrated in FIG. 24, the first plating resist layer may be removed.

The first plating resist layer 21 may be removed with, for example, a stripping solution such as sodium hydroxide. The seed layer 10' may be exposed in areas where the first plating resist layer 21 is removed.

Figure 25:
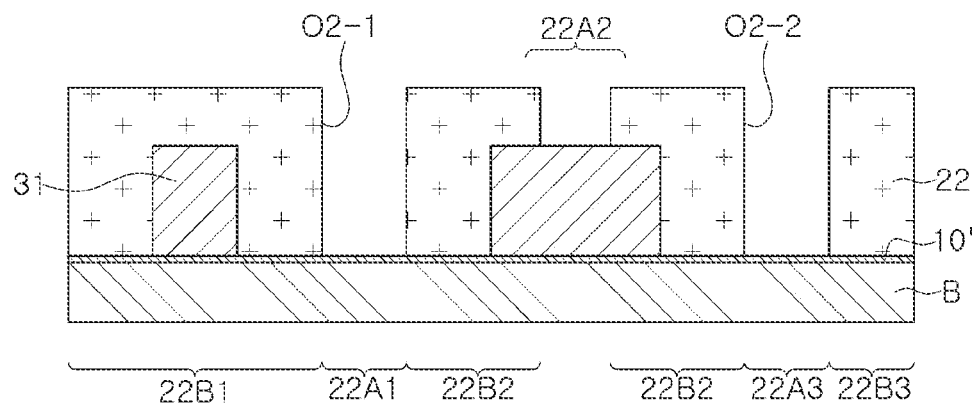

Next, as illustrated in FIG. 25, a second plating resist layer may be formed to cover the first plating patterns, and second openings spaced apart from each other may be formed in the second plating resist layer.

The second openings may be formed by exposing second exposed areas 22A1, 22A2, and 22A3 spaced apart from each other of the second plating resist layer 22 and then developing the second plating resist layer 22. Second non-exposed areas 22B1, 22B2, and 22B3 may be areas that are not exposed to light by an exposure mask. Here, at least one of the second openings O2-1 and O2-2 may be formed in a space between adjacent first plating patterns 31. In addition, at least another one of the second openings may expose at least one of the first plating patterns 31.

Figure 26:
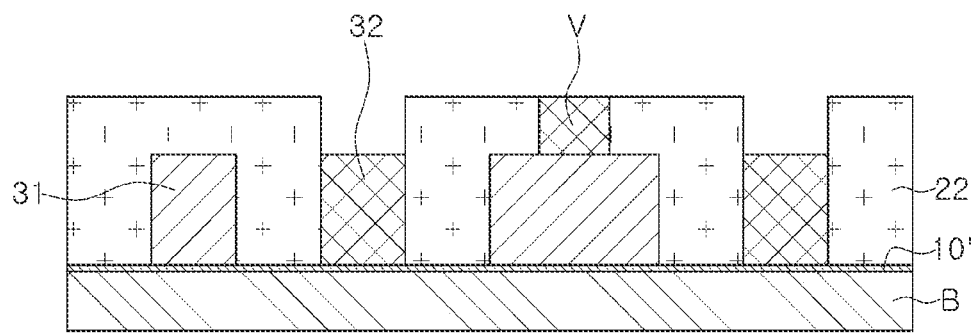

Next, as illustrated in FIG. 26, second plating patterns may be formed in the second openings of the second plating resist layer.

Second plating patterns 32 corresponding to a plating layer including a 2-1st conductor pattern P2-1 and a 2-2nd conductor pattern P2-2 may be formed in the second openings O2-1 and O2-2 of the second plating resist layer 22 formed in spaces between adjacent first plating patterns 31, and a via V may be formed in the second opening of the second plating resist layer 22 exposing the first plating pattern 31. That is, in the present exemplary embodiment, the plating layer including the 2-1st conductor pattern P2-1 and the 2-2nd conductor pattern P2-2, and the via V for connecting the first conductor pattern layer L1 and the second conductor pattern layer L2 to each other may be formed in the same step.

Figure 27:
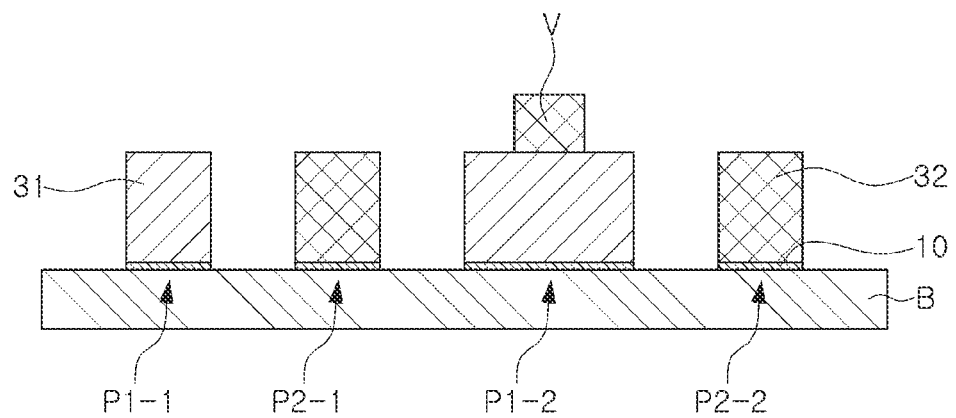

Next, referring to FIG. 27, the second plating resist layer may be removed, and partial areas of the seed layer, where the plating patterns are not formed, may be removed.

The second plating resist layer 22 may be removed with, for example, a stripping solution such as sodium hydroxide. The areas (areas where the plating patterns 31 and 32 are not formed) of the seed layer 10' exposed to the outside by the removal of the second plating resist layer 22 may be removed through flash etching or half etching. By partially removing the seed layer 10', seed patterns 10 may be formed. In this way, the first conductor pattern layer L1, including the first-group and second-group conductor patterns P1-1, P1-2, P2-1, and P2-2, and the via V illustrated in FIG. 22 may be formed.

Figure 28:
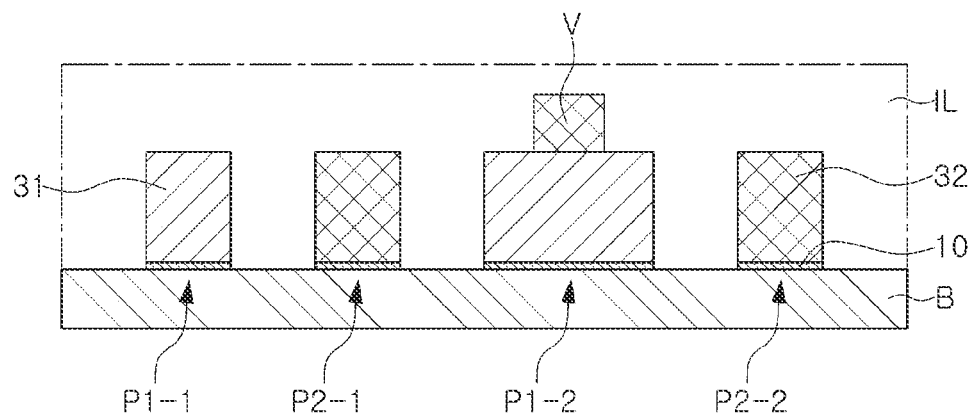

Next, referring to FIG. 28, a first insulating layer covering the first conductor pattern layer and the via may be formed on the base.

The first insulating layer IL may be formed by laminating film-type subsidiary materials such as a prepreg (PPG), an Ajinomoto build-up film (ABF), and a photo imageable dielectric (PID), or may be formed by applying a liquid insulating material.

Figure 29:
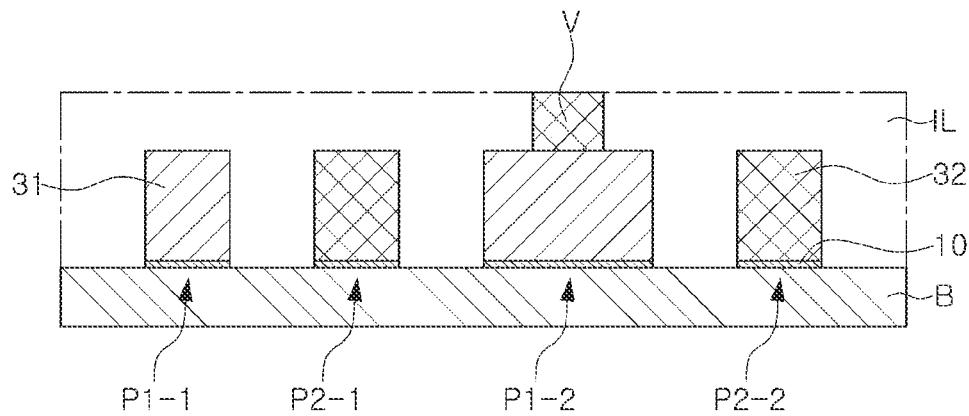

Next, referring to FIG. 29, the first insulating layer IL may be at least partially removed to expose the via.

In order to remove the first insulating layer IL, for example, a physical and/or chemical method may be used. The first insulating layer IL may be removed through, for example, chemical-mechanical polishing (CMP), but is not limited thereto. Meanwhile, while removing the first insulating layer IL to expose an upper surface of the via V, the via V may be partially removed together on an upper side thereof, but the scope of the present disclosure is not limited thereto.

Figure 30:
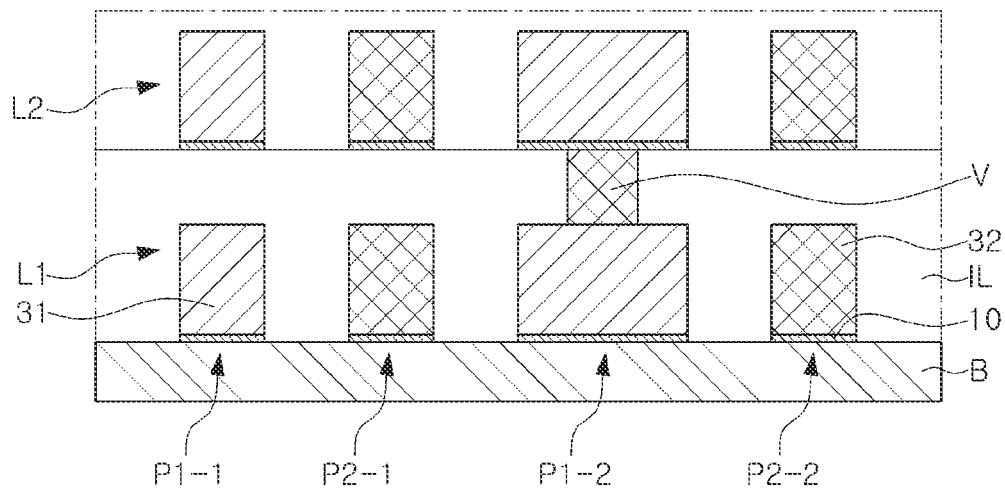

Next, referring to FIG. 30, a second conductor pattern layer and a second insulating layer may be formed on the first insulating layer.

The second conductor pattern layer L2 may be formed, for example, by using at least one of the steps described with reference to FIGS. 2 to 6, the steps described with reference to FIGS. 8 to 11, and the steps of forming the first conductor pattern layer L1 in the present exemplary embodiment.

The second insulating layer IL may be formed after forming the second conductor pattern layer L2 on the first insulating layer IL.

In the present exemplary embodiment, when forming any one conductor pattern layer L1, unlike the steps described with reference to FIGS. 2 to 6, the steps described with reference to FIGS. 8 to 11, and the steps described with reference to FIGS. 13 to 18, two plating resist layers 21 and 22 are used to perform plating twice, respectively. That is, the first plating patterns 31, which correspond to a plating layer including first-group conductor patterns P1-1 and P1-2, may be formed first using the first plating resist layer 21, and then the second plating patterns 32, which correspond to a plating layer including second-group conductor patterns P2-1 and P2-2, may be formed using the second plating resist layer 22. In addition, in the latter step, the via V may be formed together with the plating layer including the second-group conductor patterns P2-1 and P2-2.

In the present exemplary embodiment, since the second plating resist layer 22 almost covers the pre-formed first plating patterns 31, damage to the first plating patterns 31 can be minimized at the time of forming the second plating patterns 32 and/or removing the second plating resist layer 22. Furthermore, in the present exemplary embodiment, in addition to the above-described effect, since the via V is formed together with the plating layer including the second-group conductor patterns P2-1 and P2-2 at the time of forming the second plating patterns 32, the number of steps can be reduced. In addition, since the via V is formed by at least partially filling the opening of the second plating resist layer 22, the via V has a constant cross-sectional area with a conductor having a relatively large volume, as compared with a laser via or the like.

Figure 31:
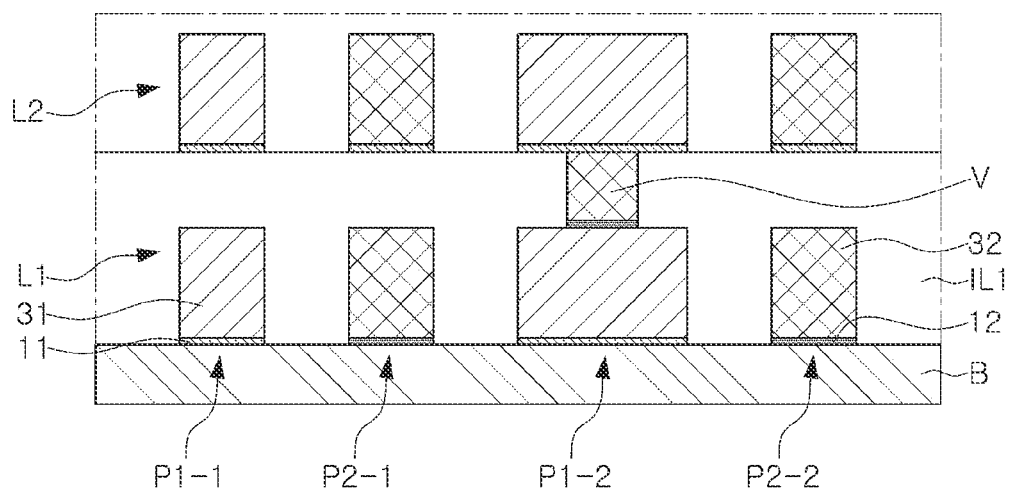
FIG. 31 is a view schematically illustrating a portion of a printed circuit board according to another exemplary embodiment of the present disclosure.

FIG. 31 is a view schematically illustrating a portion of a printed circuit board according to another exemplary embodiment of the present disclosure. FIGS. 32 to 36 are views sequentially illustrating examples of a method of manufacturing the printed circuit board illustrated in FIG. 31.

When FIGS. 31 to 36 are compared with FIGS. 22 to 30, a printed circuit board 5000 and a method of manufacturing the same according to the present exemplary embodiment are different, in terms of steps of forming seed patterns 11 and 12 and a first insulating layer IL1, from the printed circuit board 4000 according to another exemplary embodiment of the present disclosure. Therefore, in connection with the printed circuit board 5000 and the method of manufacturing the same according to the present exemplary embodiment, only the steps of forming seed patterns 11 and 12 and a first insulating layer IL1, which are different from those in another exemplary embodiment of the present disclosure, will be described. For the other configurations in the present exemplary embodiment, the description of those in another exemplary embodiment of the present disclosure may be identically applied.

Figure 32:
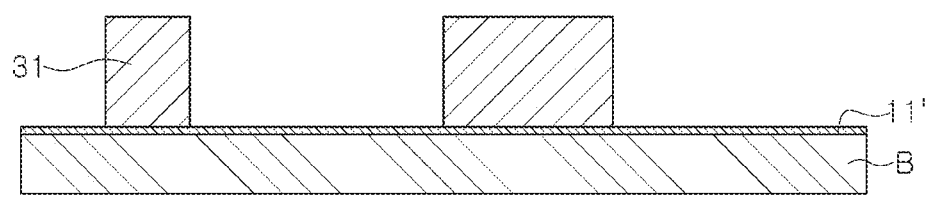
FIGS. 32 to 36 are views sequentially illustrating examples of a method of manufacturing the printed circuit board illustrated in FIG. 31.

First, as illustrated in FIG. 32, through the steps described with reference to FIGS. 23 and 24, a first seed layer and first plating patterns may be formed, and a first plating resist layer may be removed.

The first seed layer 11' may be formed in the same manner as the seed layer 10' of FIGS. 23 and 24.

Figure 33:
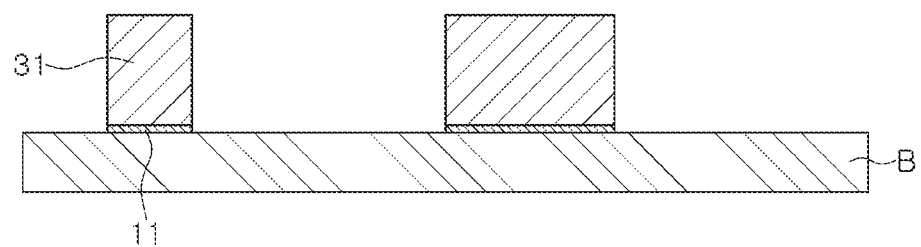

Next, as illustrated in FIG. 33, the first seed layer may be partially removed.

Areas of the first seed layer 11' exposed by the removal of the first plating resist layer, that is, partial areas of the first seed layer 11' where the first plating patterns 31 are not formed, may be removed through flash etching or half etching. By partially removing the first seed layer 11', first seed patterns 11 may be formed.

Figure 34:
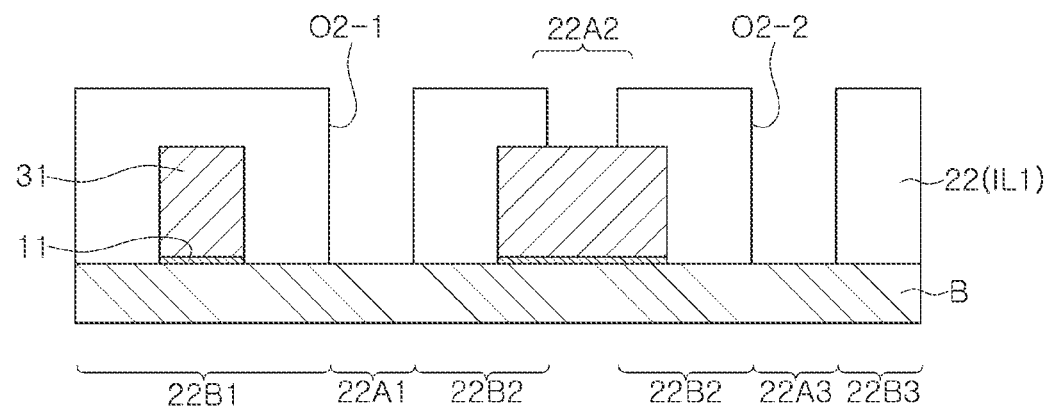

Next, as illustrated in FIG. 34, a second plating resist layer may be formed, and second openings may be formed in the second plating resist layer.

The second plating resist layer 22 applied to the present exemplary embodiment may be the first insulating layer IL1 illustrated in FIG. 31. That is, in the present exemplary embodiment, the first insulating layer IL1 may be formed of an insulating film including a photosensitive insulating material, such as PID, such that the first insulating layer IL1 is used as a permanent resist interposed between two adjacent conductor pattern layers L1 and L2 in a final product as well as the second plating resist layer 22 for forming the second plating patterns. For second exposed areas 22A1, 22A2, and 22A3, second non-exposed areas 22B1, 22B2, and 22B3, and second openings O2-1 and O2-2 of the first insulating layer IL1, which is the second plating resist layer, the description of FIG. 25 is identically applicable.

Figure 35:
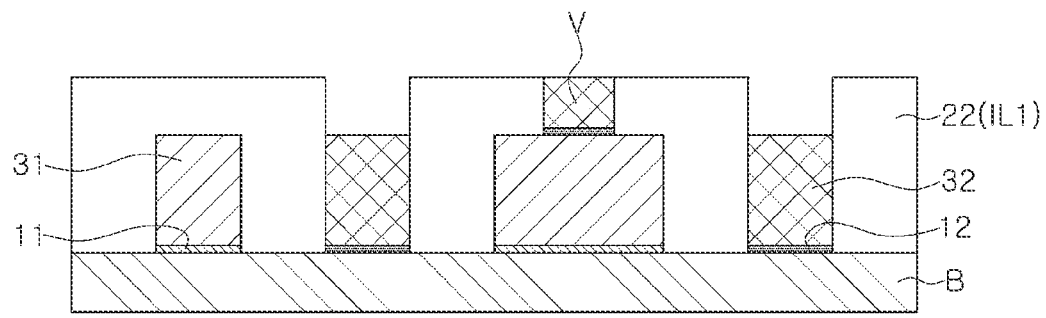

Next, as illustrated in FIG. 35, second seed patterns may be selectively formed in the second openings of the first insulating layer, which is the second plating resist layer, and second plating patterns may be formed in the second openings.

The second seed patterns 12 may be selectively formed only on lower surfaces of the second openings, for example, through selective sputtering. Alternatively, the second seed patterns 12 may be formed by forming a seed on an entire surface of the second plating resist layer 22 (the first insulating layer IL1) in which the second openings are formed, and selectively removing partial areas of the seed excluding the lower surfaces of the second openings. Meanwhile, since at least one of the second openings exposes the first plating pattern 31 as described above, at least a part of the second seed patterns 12 may be formed on an upper surface of the first plating pattern 31.

Second plating patterns 32 corresponding to a plating layer including a 2-1st conductor pattern P2-1 and a 2-2nd conductor pattern P2-2 may be formed in the second openings O2-1 and O2-2 of the second plating resist layer 22 (the first insulating layer IL1) formed in spaces between adjacent first plating patterns 31, and a via V may be formed in the second opening of the second plating resist layer 22 (the first insulating layer IL1) exposing the first plating pattern 31. That is, in the present exemplary embodiment, the plating layer including the 2-1st conductor pattern P2-1 and the 2-2nd conductor pattern P2-2, and the via V for connecting the first conductor pattern layer L1 and the second conductor pattern layer L2 to each other may be formed in the same step.

Figure 36:
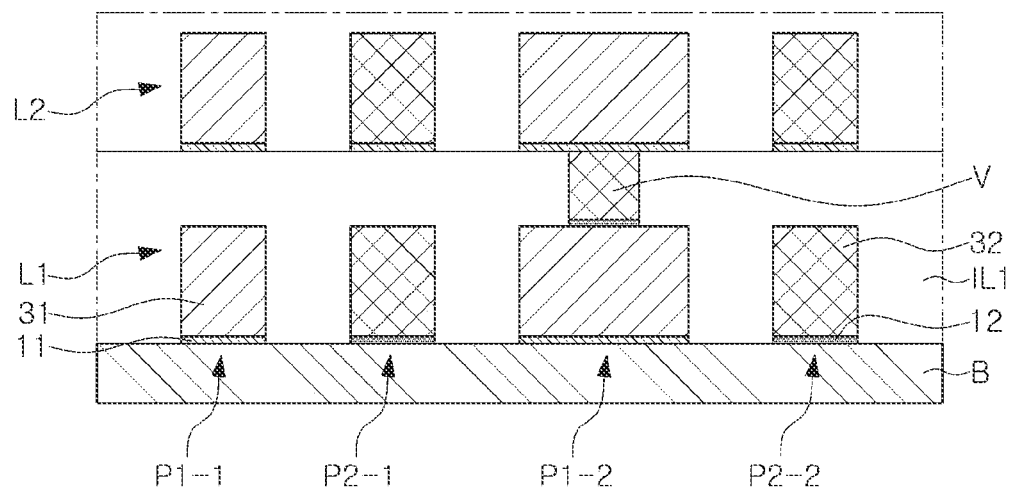

Next, as illustrated in FIG. 36, a second conductor pattern layer and a second insulating layer may be formed on the first insulating layer in which the first conductor pattern layer and the via are formed.

Meanwhile, although not illustrated, a separate filling insulating layer may be formed in partial areas of the second openings of the first insulating layer IL1, where the second plating patterns 32 and the via V are not formed. The filling insulating layer may be formed to fill only the above-described remaining areas of the second openings, or to form a layer at a predetermined thickness between the first insulating layer IL1 and the second insulating layer IL2 while filling the above-described remaining areas of the second openings.

The second conductor pattern layer L2 may be formed, for example, by using at least one of the steps described with reference to FIGS. 2 to 6, the steps described with reference to FIGS. 8 to 11, and the steps for forming the first conductor pattern layer L1 in the present exemplary embodiment.

The second insulating layer IL2 may be formed after forming the second conductor pattern layer L2 on the first insulating layer IL1.

In the present exemplary embodiment, as the second plating resist layer 22 for forming the second plating patterns 32, which correspond to a plating layer including a second-group conductor patterns P2-1 and P2-2, the first insulating layer IL1, which is an interlayer insulating layer remaining in the board as a final product, may be used, rather than using subsidiary materials that are generally removed after being temporarily used in the process of manufacturing the board. Consequently, the number of steps can be reduced, and damage to the second plating patterns can be prevented during stripping or the like for removing the plating resist layer.

Figure 37:
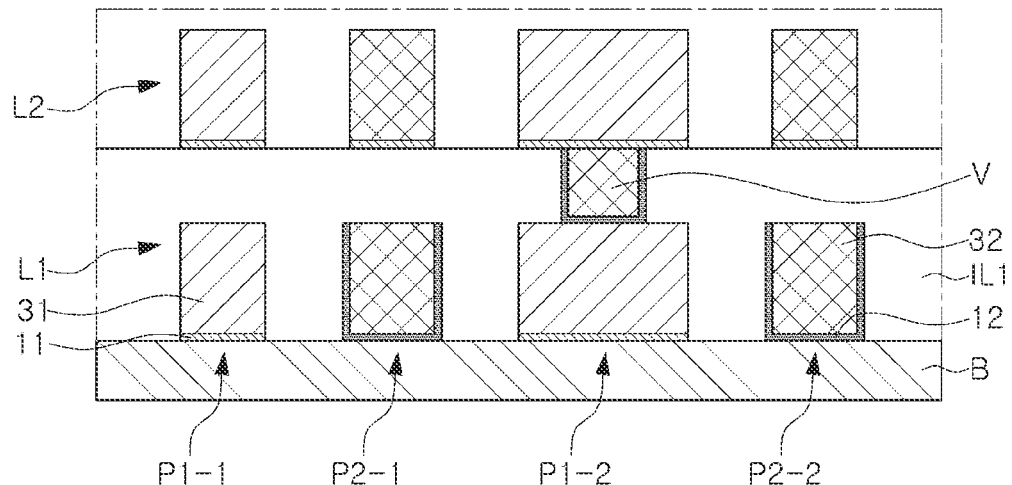
FIG. 37 is a view schematically illustrating a modified example of the printed circuit board illustrated in FIG. 31.

FIG. 37 is a view schematically illustrating a modified example of the printed circuit board illustrated in FIG. 31. FIGS. 38 to 41 are views sequentially illustrating examples of a method of manufacturing the printed circuit board illustrated in FIG. 37.

When FIGS. 37 to 41 are compared with FIGS. 31 to 36, a printed circuit board 5000' and a method of manufacturing the same according to the present modified example are different, in terms of second seed patterns 12, from the printed circuit board 5000 according to another exemplary embodiment of the present disclosure. Therefore, in connection with the printed circuit board 5000' and the method of manufacturing the same according to the present modified example, only the second seed patterns 12, which are different from those in another exemplary embodiment of the present disclosure, will be described. For the other configurations in the present exemplary embodiment, the description of those in another exemplary embodiment of the present disclosure may be identically applied.

Figure 38:
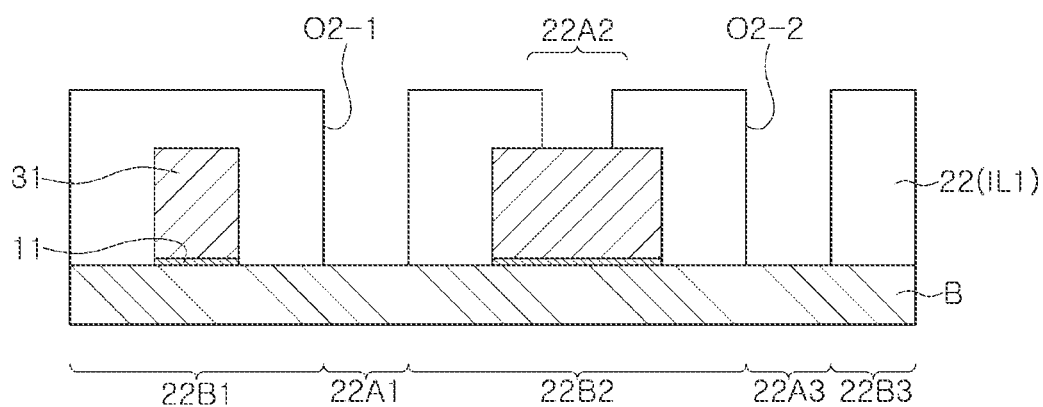
FIGS. 38 to 41 are views sequentially illustrating examples of a method of manufacturing the printed circuit board illustrated in FIG. 37.

First, as illustrated in FIG. 38, through the steps described with reference to FIGS. 32 to 34, first seed patterns and first plating patterns may be formed on the base, a second plating resist layer covering the first seed patterns and the first plating patterns may be formed, and second openings may be formed in the second plating resist layer.

Figure 39:
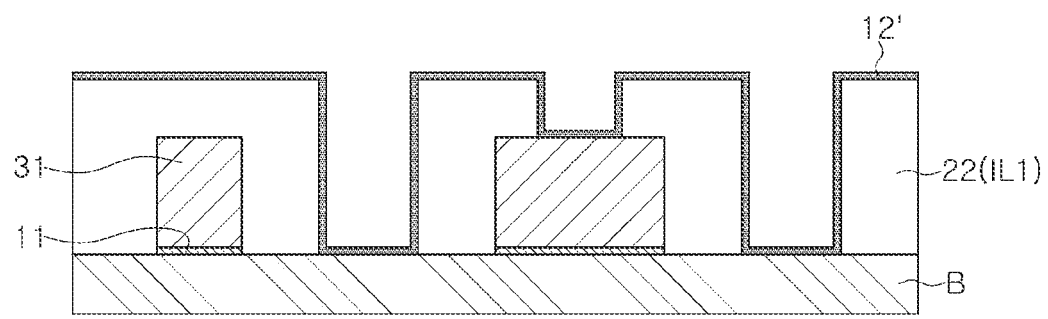

Next, as illustrated in FIG. 39, a second seed layer may be formed on an entire surface of a first insulating layer, which is the second plating resist layer.

The second seed layer 12' may be formed on the entire surface of the second plating resist layer 22 (the first insulating layer IL1) including inner walls and lower surfaces of the second openings, for example, by performing electroless plating.

Meanwhile, since at least one of the second openings exposes the first plating pattern 31 as described above, at least a part of the second seed layer 12' may be formed on an upper surface of the first plating pattern 31.

Figure 40:
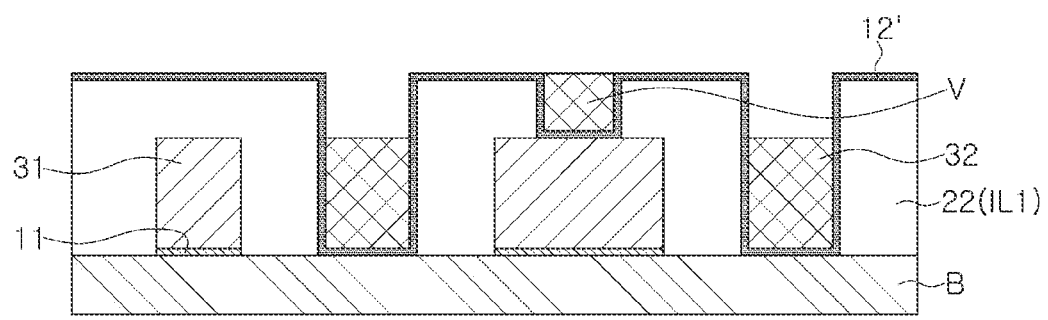

Next, referring to FIG. 40, second plating patterns may be formed at least partially in the second openings of the second plating resist layer.

Second plating patterns 32 corresponding to a plating layer including a 2-1st conductor pattern P2-1 and a 2-2nd conductor pattern P2-2 may be formed in the second openings O2-1 and O2-2 of the second plating resist layer 22 (the first insulating layer IL1) formed in spaces between adjacent first plating patterns 31, and a via V may be formed in the second opening of the second plating resist layer 22 (the first insulating layer IL1) exposing the first plating pattern 31.

Figure 41:
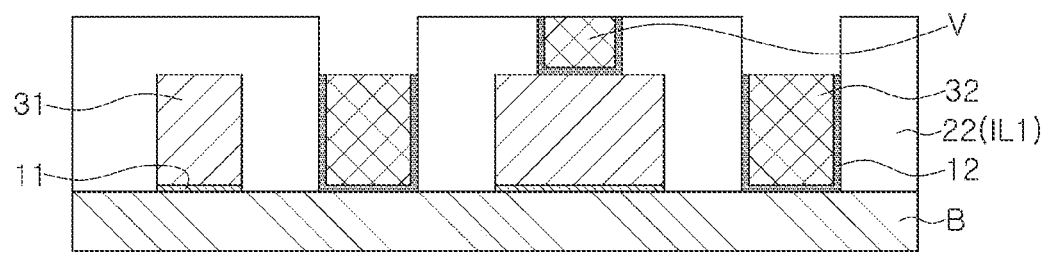

Next, referring to FIG. 41, the second seed layer may be partially removed.

Partial areas of the second seed layer 12', where the second plating patterns 32 are not formed, may be removed through flash etching or half etching. By partially removing the second seed layer 12', second seed patterns 12 may be formed. Consequently, in the present modified example, the second seed patterns 12 may be disposed around the second plating patterns 32, which correspond to a plating layer including a second-group conductor patterns P2-1 and P2-2 and a plating layer including a via V, excluding upper surfaces thereof, such that each of the second seed patterns 12 is formed on a lower surface and two opposite side surfaces of the second plating pattern 32 in an U shape.

Thereafter, although not illustrated, a second conductor pattern layer L2 and a second insulating layer IL2 may be sequentially formed on the first insulating layer IL1.

Figure 42:
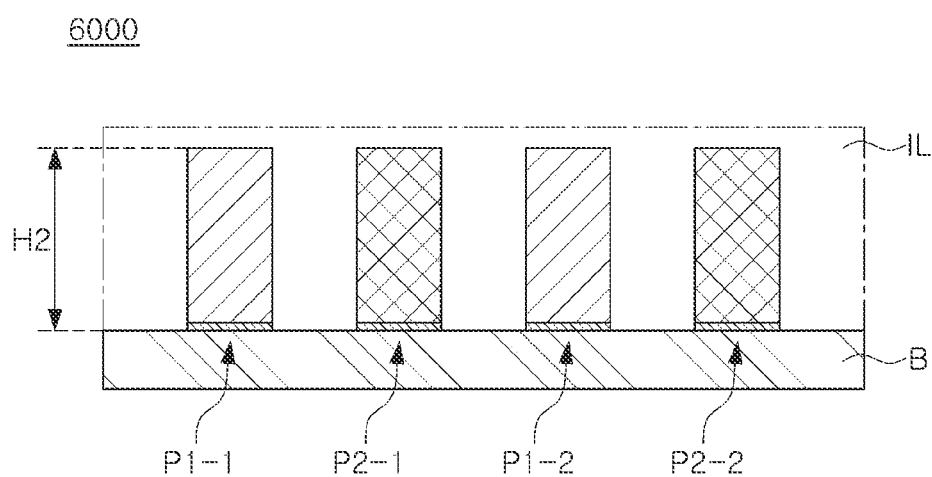
FIG. 42 is a view schematically illustrating a portion of a printed circuit board according to another exemplary embodiment of the present disclosure.

FIG. 42 is a view schematically illustrating a portion of a printed circuit board according to another exemplary embodiment of the present disclosure. FIGS. 43 to 49 are views sequentially illustrating examples of a method of manufacturing the printed circuit board illustrated in FIG. 42.

When FIGS. 43 to 49 are compared with FIGS. 7 to 11, a printed circuit board 6000 and a method of manufacturing the same according to the present exemplary embodiment are different, in terms of a step of forming a first conductor pattern layer L1, from the printed circuit board 2000 and the method of manufacturing the same according to another exemplary embodiment of the present disclosure. Therefore, in connection with the printed circuit board 6000 and the method of manufacturing the same according to the present exemplary embodiment, only the step of forming a first conductor pattern layer L1, which is different from that in another exemplary embodiment of the present disclosure, will be described. For the other configurations in the present exemplary embodiment, the description of those in another exemplary embodiment of the present disclosure may be identically applied.

Figure 43:
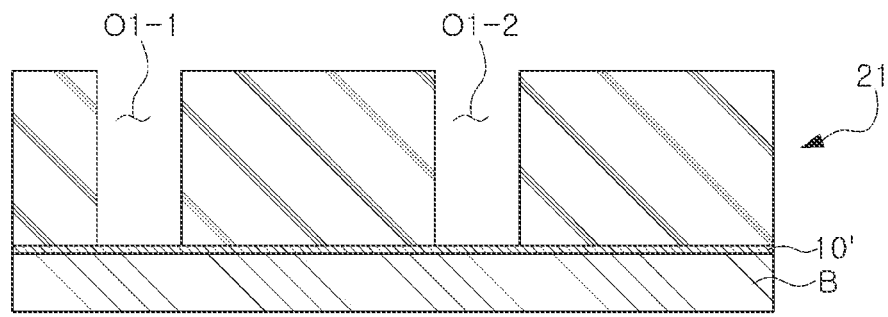
FIGS. 43 to 49 are views sequentially illustrating examples of a method of manufacturing the printed circuit board illustrated in FIG. 42.

First, as illustrated in FIG. 43, a seed layer may be formed on the base, a first plating resist layer may be formed, and first openings spaced apart from each other may be formed in the first plating resist layer.

The same has been described with reference to FIG. 23, and thus, the detailed description thereof will be omitted.

Figure 44:
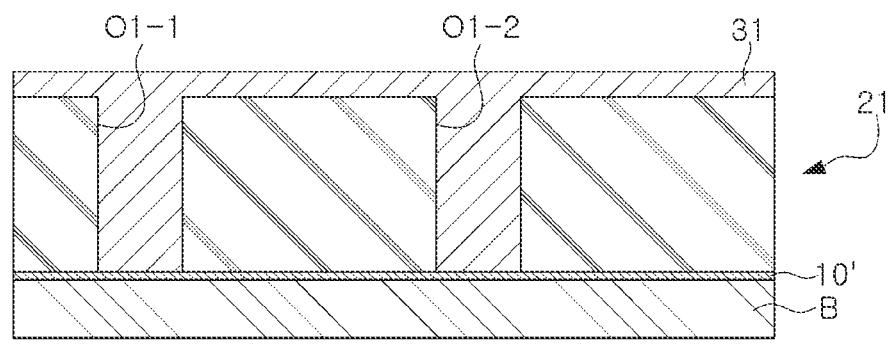

Next, as illustrated in FIG. 44, a first plating layer thicker than the first plating resist layer may be formed to fill the first openings.

In the present exemplary embodiment, over-plating may be performed so that the first plating layer 31' filling the first openings O1-1 and O1-2 is higher than the first plating resist layer 21, for example, by adjusting an electroplating time and a current density.

Figure 45:
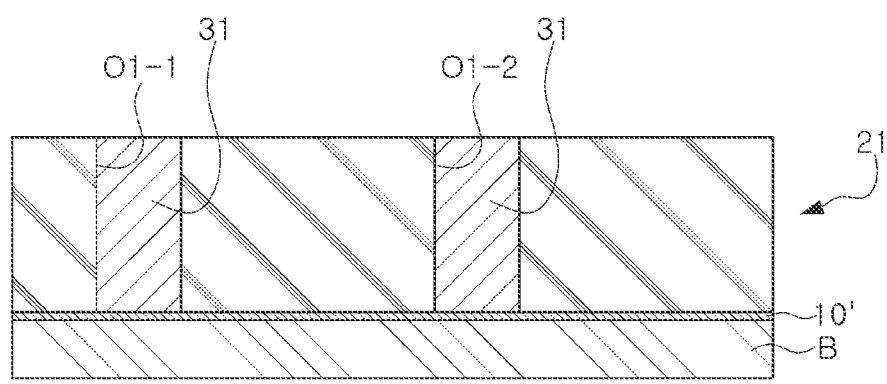

Next, as illustrated in FIG. 45, a partial area of the first plating layer located to be higher than an upper surface of the first plating resist layer, that is, an over-plated area of the first plating layer, may be removed by polishing.

The polishing may be performed using at least one of physical polishing, chemical polishing, and physicochemical polishing. For example, the polishing may be performed through half etching, but the scope of the present disclosure is not limited thereto. When this step is completed, first plating patterns 31 may be formed in the first openings O1-1 and O1-2 of the first plating resist layer 21.

Figure 46:
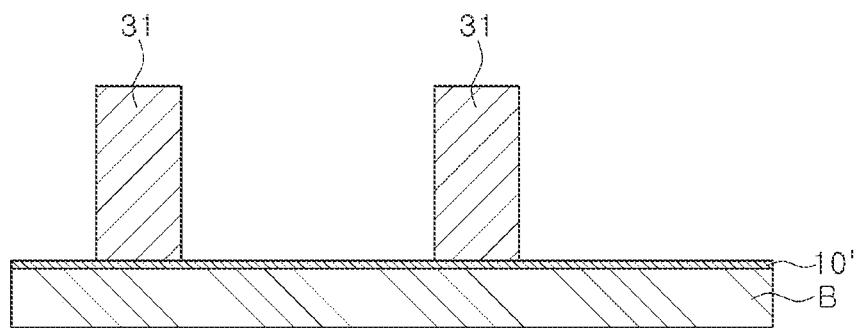

Next, as illustrated in FIG. 46, the first plating resist layer may be removed.

This may be performed in the same manner as described with reference to FIG. 24.

Figure 47:
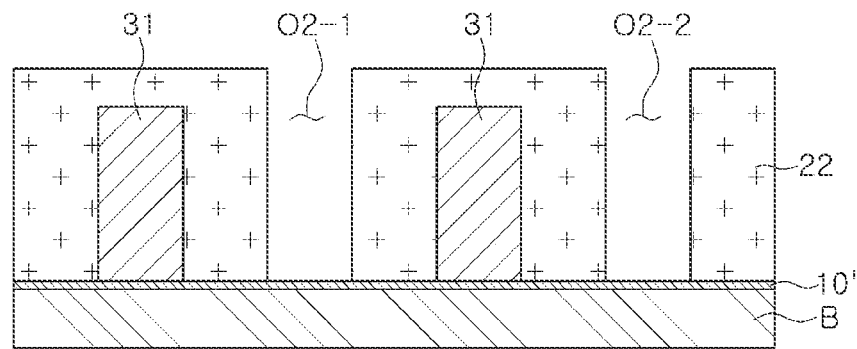

Next, as illustrated in FIG. 47, a second plating resist layer may be formed to cover the first plating patterns, and second openings spaced apart from each other may be formed in the second plating resist layer.

For this step, the step described with reference to FIG. 25 may be identically applied. Alternatively, the step described with reference to FIG. 25 may be identically applied, except that the second opening exposes at least one of the first plating patterns 31.

Figure 48:
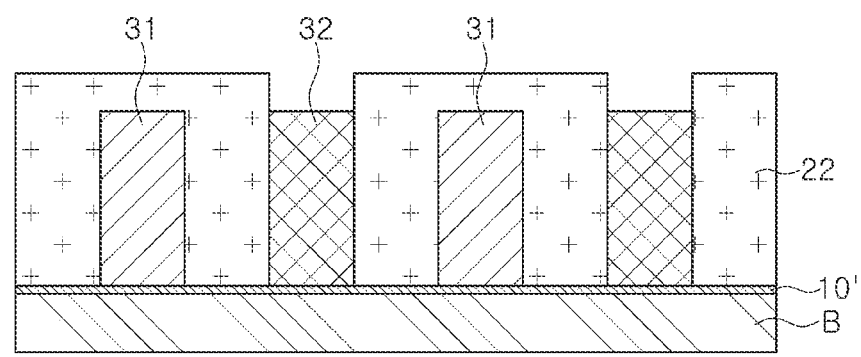

Next, as illustrated in FIG. 48, second plating patterns may be formed in the second openings of the second plating resist layer.

For this step, the step described with reference to FIG. 26 may be identically applied. Alternatively, the step described with reference to FIG. 26 may be identically applied, except that the via is formed in at least one of the second openings.

Figure 49:
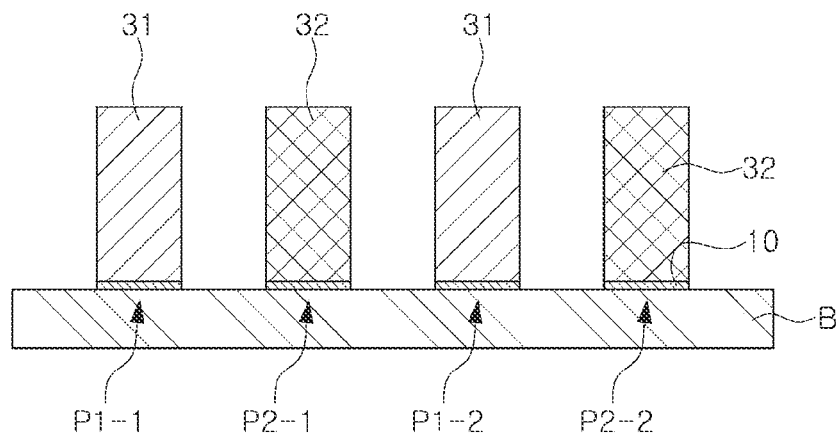

Next, as illustrated in FIG. 49, the second plating resist layer may be removed, and partial areas of the seed layer, where the first and second plating patterns are not formed, may be removed.

The second plating resist layer 22 may be removed with, for example, a stripping solution such as sodium hydroxide. The areas of the seed layer 10' (areas where the plating patterns 31 and 32 are not formed) exposed to the outside resulting from the removal of the second plating resist layer 22 may be removed through flash etching or half etching. By partially removing the seed layer 10', seed patterns 10 may be formed. In this way, the conductor pattern layer L1 including the first-group and second-group conductor patterns P1-1, P1-2, P2-1, and P2-2 illustrated in FIG. 42 may be formed.

Meanwhile, although it has been assumed in the above description that the over-plating and the polishing of the over-plated area are performed to form first plating patterns 31, this is merely an example. That is, the over-plating and the polishing of the over-plated area may also be used to form second plating patterns 32.

Figure 50:
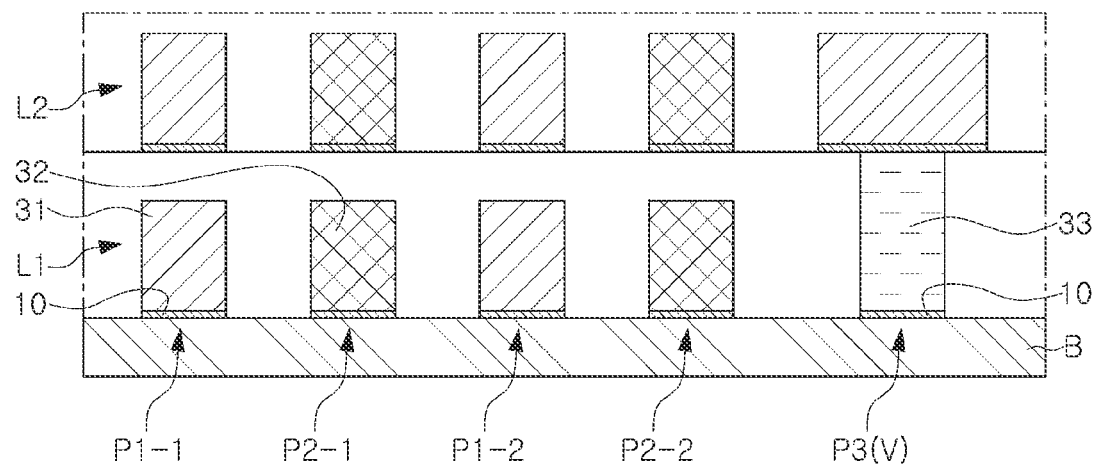
FIG. 50 is a view schematically illustrating a portion of a printed circuit board according to another exemplary embodiment of the present disclosure.

FIG. 50 is a view schematically illustrating a portion of a printed circuit board according to another exemplary embodiment of the present disclosure. FIGS. 51 to 55 are views sequentially illustrating examples of a method of manufacturing the printed circuit board illustrated in FIG. 50.

When FIGS. 50 to 55 are compared with FIGS. 22 to 30, a printed circuit board 7000 and a method of manufacturing the same according to the present exemplary embodiment are different, in terms of a step of forming a third conductor pattern P3 (V), from the printed circuit board 4000 and the method of manufacturing the same according to another exemplary embodiment of the present disclosure. Therefore, in connection with the printed circuit board 7000 and the method of manufacturing the same according to the present exemplary embodiment, only the step of forming a third conductor pattern P3 (V), which is different from that in another exemplary embodiment of the present disclosure, will be described. For the other configurations in the present exemplary embodiment, the description of those in another exemplary embodiment of the present disclosure may be identically applied.

Figure 51:
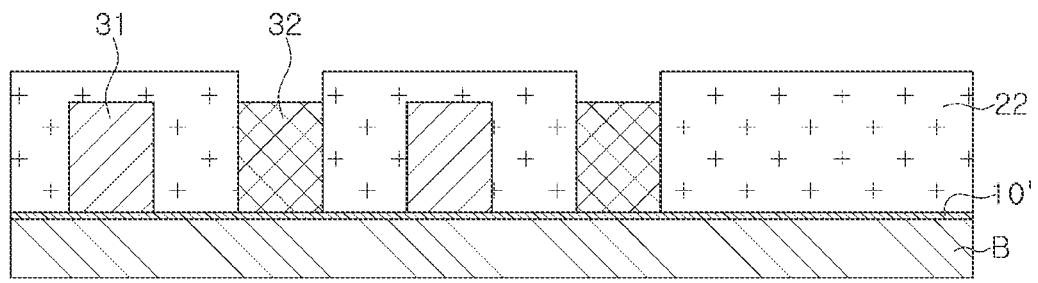
FIGS. 51 to 55 are views sequentially illustrating examples of a method of manufacturing the printed circuit board illustrated in FIG. 50.

First, as illustrated in FIG. 51, through the steps described with reference to FIGS. 23 to 26, first plating patterns, and a second plating resist layer covering the first plating patterns and having second openings may be formed, and second plating patterns may be formed in the second openings of the second plating resist layer.

In the present exemplary embodiment, unlike FIGS. 23 to 26, the second openings O2-1 and O2-2 of the second plating resist layer 22 may be formed in such a manner as to cover all of the first plating patterns 31, and accordingly, a via may not be formed at the time of forming second plating patterns 32.

Figure 52:
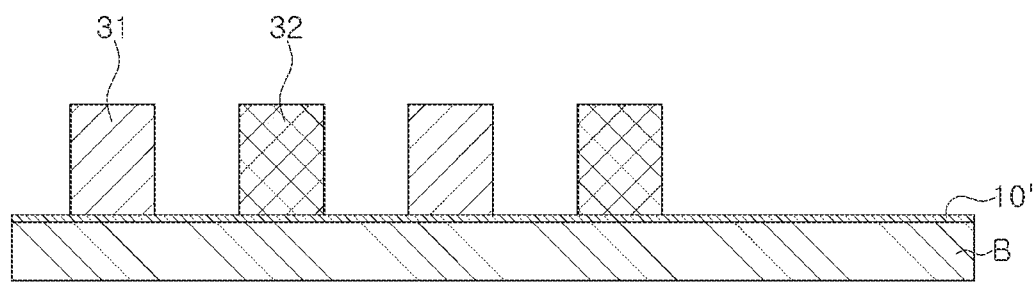

Next, as illustrated in FIG. 52, the second plating resist layer 22 may be removed.

The second plating resist layer 22 may be removed with, for example, a stripping solution such as sodium hydroxide.

Figure 53:
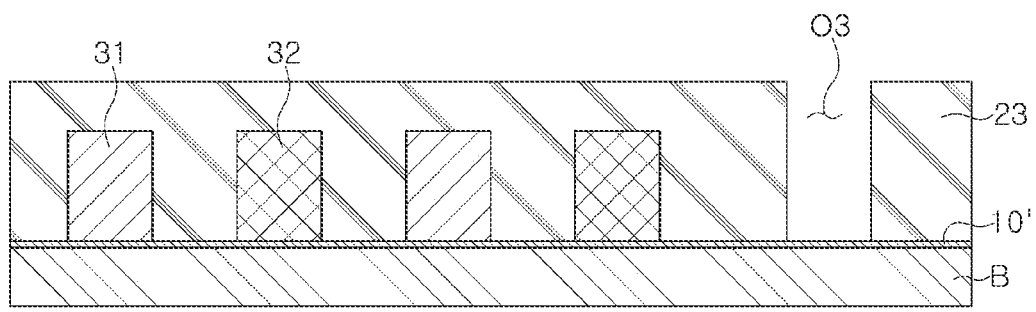

Next, as illustrated in FIG. 53, a third plating resist layer may be formed to cover the first and second plating patterns, and a third opening spaced apart from each of the first and second plating patterns may be formed in the third plating resist layer.

The third opening O3 may be formed in the third plating resist layer 23 to expose a partial area of the seed layer 10', where the first and second plating patterns 31 and 32 are not formed. Consequently, the third opening O3 may be formed in the third plating resist layer 23 to be spaced apart from each of the first and second plating patterns 31 and 32.

Figure 54:
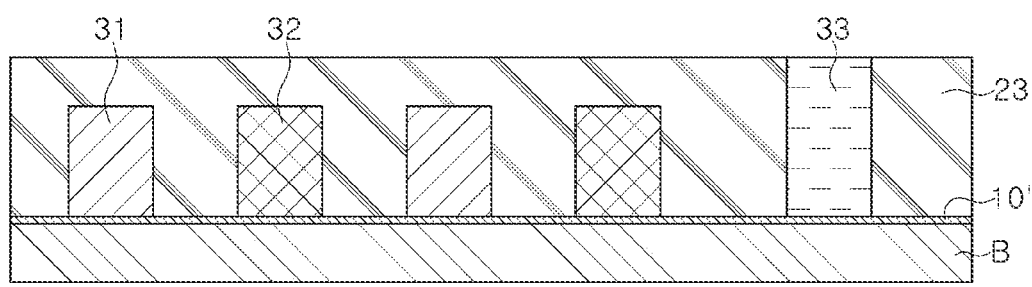

Next, as illustrated in FIG. 54, a third plating pattern may be formed in the third opening of the third plating resist layer.

The third plating pattern 33 may be formed by filling the third opening O3. In addition, the third plating pattern 33 may be formed to be higher than each of the first and second plating patterns 31 and 32. The third plating pattern 33 may be used as a via V connecting two conductor pattern layers adjacent to each other in the board 7000 according to the present exemplary embodiment through a step to be described later.

Figure 55:
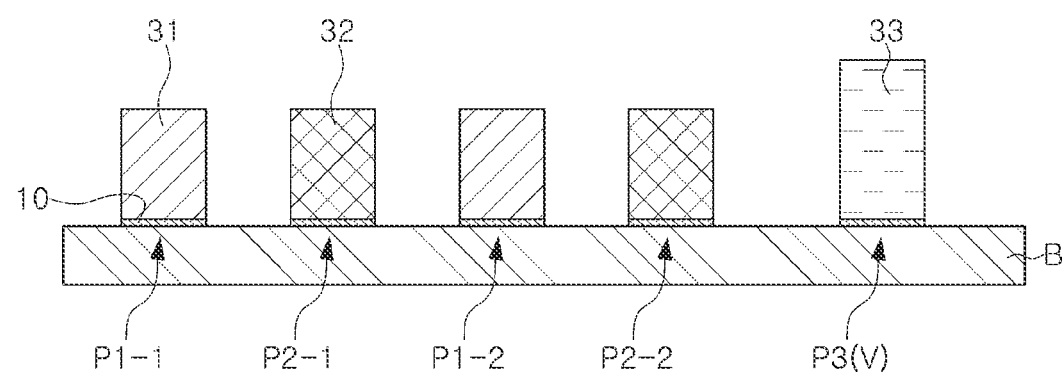

Next, referring to FIG. 55, the third plating resist layer may be removed, and a partial area of the seed layer, where the plating patterns are not formed, may be removed.

The third plating resist layer 23 may be removed with, for example, a stripping solution such as sodium hydroxide. The areas of the seed layer 10' (areas where the plating patterns 31, 32, and 33 are not formed) exposed to the outside resulting from the removal of the third plating resist layer 23 may be removed through flash etching or half etching. By partially removing the seed layer 10', seed patterns 10 may be formed. In this way, the conductor pattern layer L1 illustrated in FIG. 50, including the first and second conductor patterns P1-1, P1-2, P2-1, and P2-2, and the third conductor pattern P3 used as a via V, may be formed.

Meanwhile, although not illustrated, this may be followed by the steps described with reference to FIGS. 28 to 30.

As set forth above, according to the exemplary embodiment in the present disclosure, it is possible to form a conductor pattern layer including conductor patterns having a relatively high aspect ratio (AR) in a narrow space.

In addition, it is possible to reduce the manufacturing cost of the printed circuit board.

While exemplary embodiments have been shown and described above, it will be apparent to those skilled in the art that modifications and variations could be made without departing from the scope of the present invention as defined by the appended claims.

What is claimed is:

1. A method of manufacturing a printed circuit board, the method comprising:
    forming a resist layer;
    exposing first areas of the resist layer spaced apart from each other;
    after exposing the first areas, exposing second areas of the resist layer, the second areas being spaces between the first areas;
    forming first and second openings spaced apart from each other in the first and second areas by developing the resist layer; and
    forming a plurality of conductor patterns by filling the first and second openings with conductors,
    wherein the first openings include a 1-1st opening and a 1-2nd opening spaced apart from each other,
    the second openings include a 2-1st opening and a 2-2nd opening spaced apart from each other,
    the plurality of conductor patterns include a 1-1st conductor pattern formed in the 1-1st opening, a 1-2nd conductor pattern formed in the 1-2nd opening, a 2-1st conductor pattern formed in the 2-1st opening, and a 2-2nd conductor pattern formed in the 2-2nd opening,
    when the plurality of conductor patterns are taken in cross sections thereof in a thickness direction, each of $W_{P1-1}$, $W_{P1-2}$, $W_{P2-1}$, and $W_{P2-2}$ is 0.5 µm or more and 5 µm less, where $W_{P1-1}$ is an average line width of the 1-1st conductor pattern, $W_{P2-1}$ is an average line width of the 2-1st conductor pattern, $W_{P1-2}$ is an average line width of the 1-2nd conductor pattern, and $W_{P2-2}$ is an average line width of the 2-2nd conductor pattern, and
    a ratio of a width of each of spaces between the 1-1st, 2-1st, 1-2nd, and 2-2nd conductor patterns with respect to an average height of the 1-1st, 2-1st, 1-2nd, and 2-2nd conductor patterns is more than ¼ and less than ⅗.

2. The method of claim 1, wherein in the exposing of the second areas of the resist layer, the second areas are exposed so that the first areas are included in non-exposed areas between the second areas spaced apart from each other.

3. The method of claim 2, further comprising forming a seed layer before the forming of the resist layer,
    wherein the forming of the plurality of conductor patterns includes:

forming a plating layer on the seed layer exposed through the first and second openings by electroplating;
removing the resist layer; and
removing the seed layer.

4. The method of claim 3, wherein the forming of the plating layer on the seed layer exposed through the first and second openings by electroplating includes:
performing over-plating so that the plating layer exceeds a thickness of the resist layer; and
polishing an over-plated area of the plating layer exceeding the thickness of the resist layer.

5. The method of claim 3, wherein the seed layer is a metal layer attached onto one surface of an insulating material,
the resist layer is formed on the metal layer,
the forming of the plurality of conductor patterns further includes forming an insulating layer on the metal layer to cover the plating layer between the removing of the resist layer and the removing of the seed layer, and
the removing of the seed layer includes:
removing the insulating material from the metal layer; and
removing the metal layer attached onto the insulating layer.

6. The method of claim 1, wherein the second areas and the first areas are alternately disposed.

7. The method of claim 1, wherein when the plurality of conductor patterns are taken in the cross sections thereof in the thickness direction, each of $S_1$ to $S_3$ is 0.5 μm or more and 5 μm or less, where $S_1$ is an average space between the 1-1st conductor pattern and the 2-1st conductor pattern, $S_2$ is an average space between the 2-1st conductor pattern and the 1-2nd conductor pattern, and $S_3$ is an average space between the 1-2nd conductor pattern and the 2-2nd conductor pattern.

8. The method of claim 7, wherein $S_1$ and $S_3$ satisfy $0.9<S_1/S_3<1.1$.

9. The method of claim 8, wherein a value obtained by dividing an absolute value of a difference between $S_1$ and $S_2$ by $S_1$ is more than 0.1.

10. The method of claim 1, wherein $W_{P1-1}$ and $W_{P1-2}$ satisfy $0.9<W_{P1-1}/W_{P1-2}<1.1$.

11. The method of claim 10, wherein a value obtained by dividing an absolute value of a difference between $W_{P1-1}$ and $W_{P2-1}$ by $W_{P1-1}$ is more than 0.1.

12. The method of claim 1, wherein when the plurality of conductor patterns are taken in the cross sections thereof in the thickness direction, $H_{P1-1}$ and $H_{P1-2}$ satisfy $0.9<H_{P1-1}/H_{P1-2}<1.1$, where $H_{P1-1}$ is an average height of the 1-1st conductor pattern, $H_{P2-1}$ is an average height of the 2-1st conductor pattern, and $H_{P1-2}$ is an average height of the 1-2nd conductor pattern.

13. The method of claim 12, wherein a value obtained by dividing an absolute value of a difference between $H_{P1-1}$ and $H_{P2-1}$ by $H_{P1-1}$ is more than 0.1.

* * * * *